United States Patent
Sawayama et al.

(10) Patent No.: US 9,391,227 B2
(45) Date of Patent: Jul. 12, 2016

(54) MANUFACTURING METHOD OF SEMICONDUCTOR DEVICE

(71) Applicant: CANON KABUSHIKI KAISHA, Tokyo (JP)

(72) Inventors: Tadashi Sawayama, Machida (JP); Takashi Usui, Ashigarakami-gun (JP); Akihiro Kawano, Kawasaki (JP); Hiroaki Naruse, Yokohama (JP); Sho Suzuki, Yokohama (JP); Takehito Okabe, Atsugi (JP); Masatsugu Itahashi, Yokohama (JP); Daisuke Uki, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/959,357

(22) Filed: Aug. 5, 2013

(65) Prior Publication Data

US 2014/0045294 A1 Feb. 13, 2014

(30) Foreign Application Priority Data

Aug. 7, 2012 (JP) ................................. 2012-174842

(51) Int. Cl.
| | | |
|---|---|---|
| *H01L 31/0232* | (2014.01) | |
| *H01L 21/768* | (2006.01) | |
| *H01L 31/18* | (2006.01) | |
| *H01L 27/146* | (2006.01) | |

(52) U.S. Cl.
CPC .......... *H01L 31/18* (2013.01); *H01L 27/14629* (2013.01); *H01L 27/14636* (2013.01)

(58) Field of Classification Search
None
See application file for complete search history.

(56) References Cited

U.S. PATENT DOCUMENTS

| | | | |
|---|---|---|---|
| 2010/0194965 A1* | 8/2010 | Yamazaki | 348/340 |
| 2012/0199928 A1* | 8/2012 | Sawada et al. | 257/432 |
| 2012/0202312 A1 | 8/2012 | Suzuki et al. | |
| 2013/0200478 A1* | 8/2013 | Toyoda | 257/432 |

FOREIGN PATENT DOCUMENTS

| | | |
|---|---|---|
| JP | 2005-302894 A | 10/2005 |
| JP | 2009-164247 A | 7/2009 |
| JP | 2010-103458 A | 5/2010 |
| JP | 04866972 B1 | 2/2012 |

\* cited by examiner

*Primary Examiner* — Pamela E Perkins
(74) *Attorney, Agent, or Firm* — Canon USA Inc. IP Division

(57) ABSTRACT

A substrate includes a first region having photoelectric conversion portions and a second region having an element included in a signal processing circuit. An insulator including first and second parts respectively arranged on the first and second regions is formed on the substrate. Openings are formed in the insulator and respectively superposed on the photoelectric conversion portions. A first member is formed in the openings and on the second part of the insulator after forming the openings. At least a portion of the first member arranged on the second region is removed. The first member is planarized after removing at least the portion of the first member. A second insulator is formed on the first and second regions after planarizing the first member. A through-hole is formed in a part of the second insulator. No planarization with grinding is performed after forming the second insulator and before forming the through-hole.

5 Claims, 10 Drawing Sheets

MANUFACTURING METHOD OF SEMICONDUCTOR DEVICE

BACKGROUND OF THE INVENTION

1. Field of the Invention

Aspects of the present invention relate to a manufacturing method of a semiconductor device.

2. Description of the Related Art

In recent years, a solid-state imaging device, which is one type of a semiconductor device, including an optical waveguide to increase the quantity of light incident on a photoelectric conversion portion is suggested.

Japanese Patent Laid-Open No. 2010-103458 discloses a solid-state imaging device including a waveguide having a cladding layer with a low refractive index and a core layer with a high refractive index embedded in a groove portion surrounded by the cladding layer. The document suggests a method of forming a core layer by film deposition on the entire surface of a cladding layer having an opening corresponding to a photoelectric conversion portion, as a manufacturing method of such a solid-state imaging device. The document describes that, after the core layer is formed, a passivation layer, a planarizing film, an on-chip color filter, and an on-chip micro lens are formed.

SUMMARY OF THE INVENTION

An embodiment according to an aspect of the invention provides a manufacturing method of a semiconductor device. Preparing a semiconductor substrate. The semiconductor substrate includes a first region and a second region. A plurality of photoelectric conversion portions are formed in the first region. An element constituting a circuit configured to process signals from the plurality of photoelectric conversion portions is formed in the second region. An insulator is formed on the semiconductor substrate, the insulator including a first part arranged on the first region and a second part arranged on the second region. Forming a plurality of openings in the insulator such that the plurality of openings are respectively superposed on the plurality of photoelectric conversion portions. Forming a first member in the plurality of openings, on the first part of the insulator, and on the second part of the insulator, after forming the plurality of openings. Removing at least a portion of a part of the first member arranged on the second region. Planarizing the first member, after removing at least the portion of the first member. Forming a second insulator on the first region and the second region, after planarizing the first member. Forming a through-hole in a part of the second insulator arranged on the second region. Planarization with grinding is not performed on the second insulator in a period after the second insulator is formed and before the through-hole is formed.

An embodiment according to the invention provides a manufacturing method of a semiconductor device. Preparing a semiconductor substrate. The semiconductor substrate includes a first region and a second region. A plurality of photoelectric conversion portions are formed in the first region. An element constituting a circuit configured to process signals from the plurality of photoelectric conversion portions is formed in the second region. An insulator is formed on the semiconductor substrate, the insulator including a first part arranged on the first region and a second part arranged on the second region. Forming a plurality of openings in the insulator such that the plurality of openings are respectively superposed on the plurality of photoelectric conversion portions. Forming a first member in the plurality of openings, on the first part of the insulator, and on the second part of the insulator, after forming the plurality of openings. Removing at least a portion of a part of the first member arranged on the second region. Forming a second member on the first member and planarizing the second member, after removing at least the portion of the first member. Forming a second insulator on the first region and the second region, after planarizing the second member. Forming a through-hole in a part of the second insulator arranged on the second region. Planarization with grinding is not performed on the second insulator in a period after the second insulator is formed and before the through-hole is formed.

Further features of the present invention will become apparent from the following description of exemplary embodiments with reference to the attached drawings.

DESCRIPTION OF THE EMBODIMENTS

An embodiment according to an aspect of the invention provides a manufacturing method of a semiconductor device including a semiconductor substrate including a first region and a second region, and an insulator arranged on the first region and the second region. A plurality of openings are formed with a first density in a part of the insulator arranged on the first region of the semiconductor substrate. A plurality of openings are formed with a second density, which is smaller than the first density, in a part of the insulator arranged on the second region of the semiconductor substrate. Then, an embedded member is embedded in the plurality of openings on the first region. According to another embodiment of the invention, an opening may not be formed in the part of the insulator arranged on the second region. With this configuration, a film of the embedded member is reduced in thickness only on the second region.

An embodiment according to another aspect of the invention provides a manufacturing method of a solid-state imaging device. A solid-state imaging device is a semiconductor device including a semiconductor substrate arranged with a plurality of photoelectric conversion portions. A region, where the plurality of photoelectric conversion portions are arranged, may be a first region of the semiconductor substrate. This embodiment is a manufacturing method of forming an optical waveguide, for example, by forming a plurality of openings respectively corresponding to the plurality of photoelectric conversion portions, and embedding a high refraction material in the plurality of openings. In this case, a second region is a peripheral region, where an element constituting a circuit configured to process signals generated from the photoelectric conversion portions, are arranged. In general, the openings for forming the optical waveguide are not provided in the peripheral region, or even if the openings are provided, the number of the openings in the peripheral region is smaller than that in an imaging region.

Figure 1A:
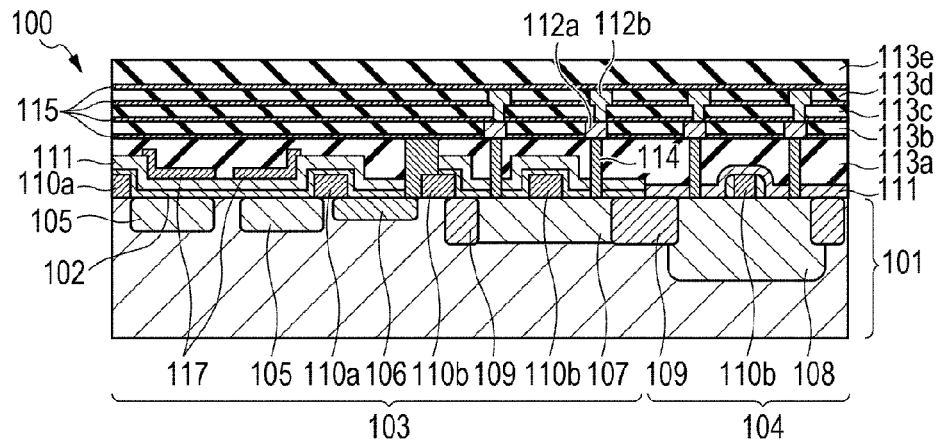
FIGS. 1A to 1C are illustrations showing a manufacturing method of a solid-state imaging device according to a first embodiment.

A manufacturing method of a solid-state imaging device is described as an example of an embodiment of the invention. As shown in FIG. 1A, a semiconductor substrate 101 includes an imaging region 103, where a plurality of photoelectric conversion portions 105 are arranged, and a peripheral region 104, where an element constituting a circuit configured to process signals from the photoelectric conversion portions 105 is arranged. The imaging region 103 is a first region, and the peripheral region 104 is a second region. The photoelectric conversion portions 105 are, for example, photodiodes. The element constituting the circuit configured to process the signals from the photoelectric conversion portions 105 is, for example, a transistor. An insulator is arranged on the semiconductor substrate 101. The insulator is, for example, a plurality of interlayer insulating films 113a to 113e.

Figure 1B:
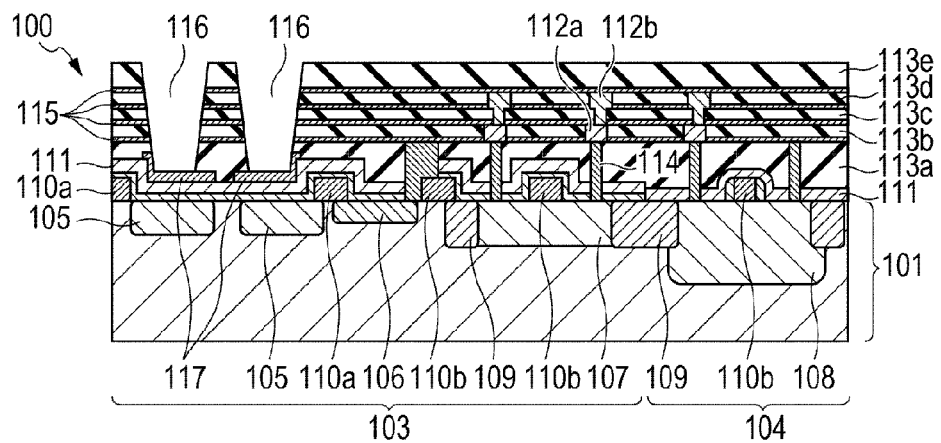

First, as shown in FIG. 1B, openings 116 are formed in the insulator. The openings are formed in the insulator at positions at which the openings are superposed on the plurality of photoelectric conversion portions 105. A large number of the photoelectric conversion portions 105 may be arranged in the imaging region 103. Hence, the imaging region 103 has the openings with a higher density than the density of the openings in the peripheral region 104.

Figure 1C:
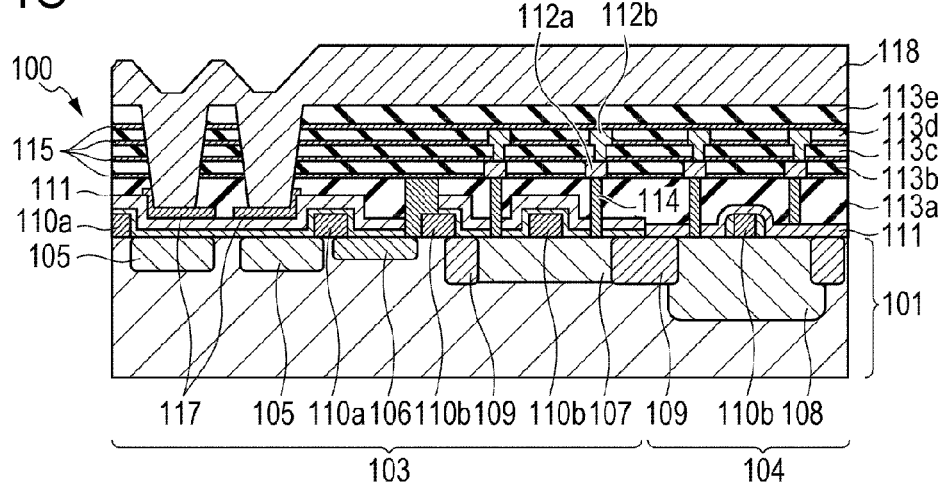

Next, as shown in FIG. 1C, a first waveguide member 118 is formed on the insulator with the openings formed therein. The first waveguide member 118 is formed on the insulator arranged in the imaging region 103 so as to fill the inside of the openings 116. Further, the first waveguide member 118 is formed on the insulator arranged in the peripheral region 104. At this time, the inside of the openings do not have to be entirely filled. A gap may remain in a portion of the inside of the openings.

Figure 2A:
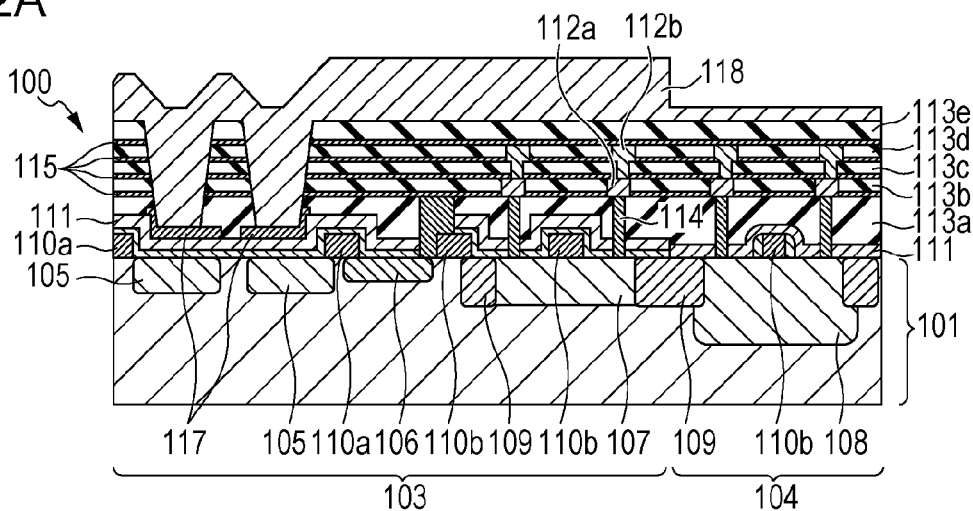
FIGS. 2A to 2C are illustrations showing the manufacturing method of the solid-state imaging device according to the first embodiment.

Then, as shown in FIG. 2A, a part of the first waveguide member 118 arranged in the peripheral region 104 is removed. A removing method may be etching or lift-off. The part to be removed of the first waveguide member 118 is described in a plan view and in a view in a depth direction.

In a plan view, at least a portion of the part of the first waveguide member 118 arranged in the peripheral region 104 is removed. Alternatively, a major portion of the part arranged in the peripheral region 104 may be removed. Still alternatively, the entirety of the part arranged in the peripheral region 104 may be removed.

Regarding the removal in the depth direction, at least a portion of the first waveguide member 118 may be removed. That is, the first waveguide member 118 arranged in the peripheral region 104 may be at least reduced in thickness to be a thin film. A portion of the first waveguide member 118 may remain, so that the insulator, which is an under layer thereof, is not exposed. Alternatively, the entirety of the first waveguide member 118 may be removed in the depth direction. That is, the first waveguide member 118 may be removed until the insulator, which is the under layer, is exposed.

Figure 2B:
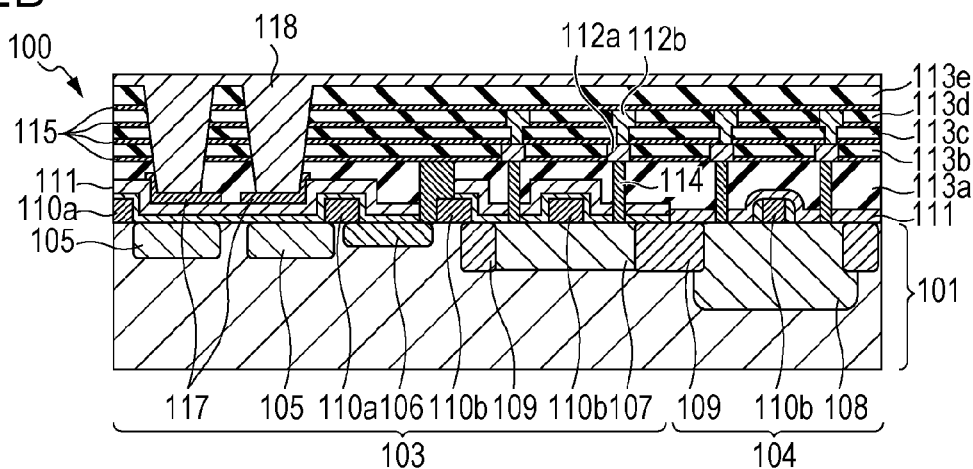

Then, as shown in FIG. 2B, after the part of the first waveguide member 118 arranged in the peripheral region 104 is removed, the first waveguide member 118 in the imaging region 103 and the peripheral region 104 are planarized.

Advantages obtained by the manufacturing method are described. If the first waveguide member 118 is formed on surfaces with different densities of the openings 116, such as the imaging region 103 and the peripheral region 104, a step is generated between the part with the high density of the openings 116 and the part with the low density of the openings 116. In a planarizing step of related art, the step could not be sufficiently reduced. Even if the openings 116 are arranged only in the imaging region 103 and the opening is not arranged in the peripheral region 104, a step may be generated between the first waveguide member 118 in the imaging region 103 and the first waveguide member 118 in the peripheral region 104.

In contrast, the manufacturing method of the embodiment according to the invention includes a step of removing the part of the first waveguide member 118 arranged in the peripheral region 104. The part arranged in the peripheral region 104 is a high part of the step. With this removing step, the step between the imaging region 103 and the peripheral region 104 can be reduced by a certain degree before the planarizing step. Hence, in the subsequent planarizing step, the exposed surface can be sufficiently planarized.

In the manufacturing method of the semiconductor device, a plurality of chips are typically formed on a single wafer. In particular, in the solid-state imaging device, the imaging region 103 and the peripheral region 104 are alternately arranged with a relatively long period. Hence, a step with a long period may be likely generated. It is difficult to reduce such a step by a method like CMP, the above-described problem is particularly noticeable in the manufacturing method of the solid-state imaging device of related art. Hence, according to the embodiment of the manufacturing method of the solid-state imaging device, an effect of increasing flatness is high.

The invention is not limited to the manufacturing method of the solid-state imaging device. For example, when wiring is formed by a damascene method (described later), a metal film is formed on an insulator with openings formed therein. At this time, if there is a distribution of high and low densities of the openings arranged in the insulator, the metal film may be formed by a relatively large thickness at a part in which the openings are arranged with the high density, and the metal film may be formed by a relatively small thickness at a part in which the openings are arranged with the low density. The damascene method is widely used as a method of forming wiring in a typical semiconductor device other than the solid-state imaging device. In this case, by applying the present invention, the step can be reduced.

A case in which an electron serves as a signal carrier is described below; however, a hole may serve as a signal carrier. If the hole serves as a signal carrier, a conduction type of a semiconductor region may be inverted.

The inventors found a problem of difficulty in planarization of a solid-state imaging device with a manufacturing method of the solid-state imaging device described in Japanese Patent Laid-Open No. 2010-103458. Therefore, in related art, it was difficult to form an on-chip color filter or an on-chip micro lens with high accuracy. As the result, image quality was decreased. Also, even for a semiconductor device other than the solid-state imaging device, the height is increased by an increase in degree of integration, and there is a problem of difficulty in planarization in a manufacturing process.

As described above, in related art, it was difficult to form a semiconductor device with high accuracy. According to embodiments of the invention, a semiconductor device can be manufactured with high accuracy. In particular, a solid-state imaging device with high image quality can be manufactured.

First Embodiment

A manufacturing method of a solid-state imaging device of a first embodiment according to the invention is described with reference to the drawings. FIGS. 1A to 1C, and 2A to 2C are schematic illustrations of a sectional structure of the solid-state imaging device in steps of this embodiment.

A solid-state imaging device 100 includes a semiconductor substrate 101. The semiconductor substrate is a part made of a semiconductor material from among members constituting the solid-state imaging device. For example, the semiconductor substrate includes a configuration in which a semiconductor region is formed by a known semiconductor manufacturing process in a semiconductor wafer. The semiconductor material may be, for example, silicon. An interface between the semiconductor material and another material is a principal surface 102 of the semiconductor substrate. For example, the other material is a thermal oxide film arranged on the semiconductor substrate and being in contact with the semiconductor substrate.

In this embodiment, the semiconductor substrate 101 may use a known semiconductor substrate. The semiconductor substrate 101 includes a P-type semiconductor region and an N-type semiconductor region arranged therein. The semiconductor substrate 101 has a principal surface 102. In this embodiment, the principal surface 102 is an interface between the semiconductor substrate 101 and a thermal oxide film (not shown) laminated on the semiconductor substrate 101. The semiconductor substrate 101 includes an imaging region 103, where a plurality of pixels are arranged, and a peripheral region 104, where an element constituting a signal processing circuit configured to process signals from the pixels is arranged. The imaging region 103 and the peripheral region 104 will be described later.

In this specification, a plan is a plane parallel to the principal surface 102. For example, the principal surface 102 in a region, where photoelectric conversion portions are arranged, or the principal surface 102 in a channel of a MOS transistor may serve as the reference. In this specification, a cross section is a plane intersecting with the plan.

In a step shown in FIG. 1A, the semiconductor regions are formed in the semiconductor substrate 101, and a gate electrode and multilayer wiring are formed on the semiconductor substrate 101. Photoelectric conversion portions 105, a floating diffusion (hereinafter, FD) 106, and source and drain regions of a well 107 for the pixel transistor are formed in the imaging region 103 of the semiconductor substrate 101. The photoelectric conversion portions 105 are, for example, photodiodes. The photoelectric conversion portions 105 contain the N-type semiconductor region arranged in the semiconductor substrate 101. An electron generated by photoelectric conversion is collected in the N-type semiconductor region of the photoelectric conversion portion. The FD 106 is the N-type semiconductor region. Electrons generated by the photoelectric conversion portion 105 are transferred to the FD 106, and is converted into voltages. The FD 106 may be electrically connected with an input node of an amplifier. Alternatively, the FD 106 may be electrically connected with a signal output line. In this embodiment, the FD 106 is electrically connected with a gate electrode 110b of an amplification transistor through a plug 114. Source and drain regions of an amplification transistor that amplifies signals and a reset transistor that rests an input node of the amplification transistor are formed in the well 107 for the pixel transistor. A well 108 for a peripheral transistor is formed in the peripheral region 104 of the semiconductor substrate 101. Source and drain regions of the peripheral transistor constituting a signal processing circuit are formed in the well 108 for the peripheral transistor. Also, an element isolation portion 109 may be formed in the semiconductor substrate 101. The element isolation portion 109 electrically isolates the pixel transistor or the peripheral transistor from other elements. The element isolation portion 109 is, for example, shallow trench isolation (STI) or a local oxidation of silicon (LOCOS).

Also, in this step, a transfer gate electrode 110a and a gate electrode 110b are formed. The transfer gate electrode 110a and the gate electrode 110b are arranged on the semiconductor substrate 101 through an oxide film (not shown). The transfer gate electrode 110a controls transfer of an electric carrier between the photoelectric conversion portion 105 and the FD 106. The gate electrode 110b serves as a gate of the pixel transistor and a gate of the peripheral transistor.

Further, in this step, a protection layer 111 is formed on the semiconductor substrate 101. For example, the protection layer 111 is a silicon nitride film. Alternatively, the protection layer 111 may be formed of a plurality of layers including a silicon nitride film or a silicon oxide film. The protection layer 111 may have a function of reducing damage on the photoelectric conversion portions in a subsequent step. Alternatively, the protection layer 111 may have a function of antireflection. Still alternatively, the protection layer 111 may have a function of preventing metal from being dispersed in a silicide step. Also, an etch-stop member 117 is formed at a side of the protection layer 111 opposite to the semiconductor substrate 101. The etch-stop member 117 may have a larger area in a plan view than the bottom area of an opening 116 which is formed later. The protection layer 111 and the etch-stop member 117; however, do not have to be necessarily formed.

Then, a first wiring layer 112a, a second wiring layer 112b, and a plurality of interlayer insulating films 113a to 113e are formed. In this embodiment, the first wiring layer 112a and the second wiring layer 112b are formed by the damascene method. For the convenience of description, first to fifth interlayer insulating films 113a to 113e are arranged in that order from the position close to the semiconductor substrate 101.

The first interlayer insulating film 113a is formed in the imaging region 103 and the peripheral region 104. If required, a surface of the first interlayer insulating film 113a at the side opposite to the semiconductor substrate 101 may be planarized. A through-hole is formed in the first interlayer insulating film 113a. A plug 114 that electrically connects a conductive member of the first wiring layer 112a with the semiconductor region of the semiconductor substrate 101 is arranged in the through-hole. The plug 114 is formed of a conductive material. For example, the plug 114 is made of tungsten.

Then, the second interlayer insulating film 113b is formed on the first interlayer insulating film 113a at the side opposite to the semiconductor substrate 101. A part of the second interlayer insulating film 113b corresponding to a region, where the conductive member of the first wiring layer 112a is arranged, is removed by etching. Then, a metal film serving as a material of the first wiring layer is formed in the imaging region 103 and the peripheral region 104. Then, the metal film is removed by, for example, CMP, until the second interlayer insulating film is exposed. With this process, the conductive member forming the wiring of the first wiring layer 112a is arranged with a predetermined pattern.

Then, the third interlayer insulating film 113c and the fourth interlayer insulating film 113d are formed in the imaging region 103 and the peripheral region 104. A part of the fourth interlayer insulating film 113d corresponding to a region, where the conductive member of the second wiring layer 112b is arranged, is removed by etching. Then, a part of the third interlayer insulating film 113c corresponding to a region, where the plug that electrically connects the conductive member of the first wiring layer 112a with the conductive member of the second wiring layer 112b is arranged, is removed by etching. Then, a metal film serving as a material of the second wiring layer and the plug is formed in the imaging region 103 and the peripheral region 104. Then, the metal film is removed by, for example, CMP, until the fourth interlayer insulating film is exposed. With this process, a wiring pattern of the second wiring layer 112b and a pattern of the plug are obtained. After the third interlayer insulating film 113c and the fourth interlayer insulating film 113d are formed, a part of the third interlayer insulating film 113c and a part of the fourth interlayer insulating film 113d corresponding to the region, where the plug is arranged, may be removed by etching, the plug being configured to electrically connect the conductive member of the first wiring layer 112a with the conductive member of the second wiring layer 112b.

Finally, the fifth interlayer insulating film 113e is formed in the imaging region 103 and the peripheral region 104. If required, a surface of the fifth interlayer insulating film 113e at the side opposite to the semiconductor substrate 101 may be planarized by a method such as CMP.

The first wiring layer 112a and the second wiring layer 112b may be formed by a method other than the damascene method. An example method other than the damascene method is described. After the first interlayer insulating film 113a is formed, the metal film being the material of the first wiring layer is formed in the imaging region 103 and the peripheral region 104. Then, a part of the metal film except for the region, where the conductive member of the first wiring layer 112a is arranged, is removed by etching. Accordingly, a wiring pattern of the first wiring layer 112a is obtained. Then, the second interlayer insulating film 113b and the third interlayer insulating film 113c are formed, and the second wiring layer 112b is formed similarly. After the second wiring layer 112b is formed, the fourth interlayer insulating film 113d and the fifth interlayer insulating film 113e are formed. Surfaces of the third interlayer insulating film 113c and the fifth interlayer insulating film 113e at the side opposite to the semiconductor substrate 101 are planarized if required.

The first wiring layer 112a and the second wiring layer 112b are arranged by different heights with reference to the principal surface of the semiconductor substrate 101. In this embodiment, the conductive members of the first wiring layer 112a and second wiring layer 112b are formed of copper. Alternatively, the conductive members may be formed of a material other than copper as long as the material is conductive. The conductive member of the first wiring layer 112a and the conductive member of the second wiring layer 112b are insulated from each other by the interlayer insulating film 113c except for the parts at which the conductive members are electrically connected through the plug. The number of wiring layers is not limited to two, and may be one, or three or more.

Also, an etch-stop film, a metal diffusion preventing film, or a film having functions of both etch-stop and metal-diffusion prevention may be arranged between each neighboring interlayer insulating films. In this embodiment, the plurality of interlayer insulating films 113a to 113e are silicon oxide films. A silicon nitride film serves as a diffusion preventing film for a silicon oxide film. Hence, a diffusion preventing film 115 is arranged between each neighboring interlayer insulating films. The diffusion preventing film 115; however, does not have to be necessarily provided.

As described above, in the step shown in FIG. 1A, the semiconductor substrate including the imaging region 103 serving as the first region and the peripheral region 104 serving as the second region, and the plurality of interlayer insulating films 113a to 113e serving as the insulator are arranged on the first region and the second region, is prepared.

In FIG. 1B, openings 116 are formed in a region, where the openings 116 are superposed on the photoelectric conversion portions 105, of the plurality of interlayer insulating films 113a to 113e. If the diffusion preventing film 115 is arranged, openings are formed in the diffusion preventing film 115.

First, a mask pattern for etching (not shown) is laminated on the interlayer insulating film 113e at the side opposite to the semiconductor substrate 101. The mask pattern for etching is arranged on a region except for regions, where the openings 116 are arranged. In other words, the mask pattern for etching has openings in regions, where the openings 116 are arranged. The mask pattern for etching is a photoresist that is patterned by, for example, photolithography and development.

Then, the plurality of interlayer insulating films 113a to 113e and the diffusion preventing film 115 are etched by using the mask pattern for etching as a mask. Accordingly, the openings 116 are formed. Alternatively, the openings 116 may be formed by performing etching a plurality of times under different conditions. After the etching, the mask pattern for etching may be removed.

If the etch-stop member 117 is arranged, in a step of FIG. 1B, etching may be performed until the etch-stop member 117 is exposed. The etch-stop member 117 may have a smaller etching rate under an etching condition for etching the interlayer insulating film 113a than the etching rate of the interlayer insulating film 113a. If the interlayer insulating film 113a is a silicon oxide film, the etch-stop member 117 may be a silicon nitride film or a silicon oxynitride film. Alternatively, the etch-stop member 117 may be exposed by performing etching a plurality of times under different conditions.

Regarding the cross-section shape of each opening 116, the opening 116 does not have to necessarily penetrate through all the first to fifth interlayer insulating films 113a to 113e. A recess of the fifth interlayer insulating film 113e may serve as the opening 116. Alternatively, the opening 116 may penetrate through only a portion of the first to fifth interlayer insulating films 113a to 113e. Regarding the plan shape of the opening 116, the boundary of the opening 116 is a circular or rectangular closed loop. Alternatively, the plan shape of the opening 116 may be like a groove extending to the plurality of photoelectric conversion portions 105. That is, in the specification, the interlayer insulating film 113e may have the opening 116 if a region, where the interlayer insulating film 113e is not arranged, is surrounded by a region, where the interlayer insulating film 113e is arranged or sandwiched between regions where the interlayer insulating film 113e, is arranged in a plan.

Regarding the position of the opening 116 in a plan, at least a portion of the opening 116 is superposed on the photoelectric conversion portion 105 in a plan. That is, when the opening 116 and the photoelectric conversion portion 105 are projected in the same plan, a region, where both the opening 116 and the photoelectric conversion portion 105 are projected, is present in the same plan.

In this embodiment, the opening 116 is formed in the region, where the opening 116 is superposed on the photoelectric conversion portion 105, and the opening 116 is not formed in the peripheral region 104. However, the opening 116 may be formed in the peripheral region 104. In this case, the density of the openings 116 formed in the imaging region 103 should be higher than the density of the openings 116 formed in the peripheral region 104. The density of the openings 116 may be determined by the number of the openings 116 per unit area arranged in a plan. More specifically, the number of the openings 116 per unit area arranged in the peripheral region 104 is smaller than the number of the openings 116 per unit area arranged in the imaging region 103. Alternatively, the density of the openings 116 may be determined in accordance with the ratio of the area occupied by the openings 116 in a plan. More specifically, the ratio of the area occupied by the plurality of openings 116 arranged in the peripheral region 104 is smaller than the ratio of the area occupied by the plurality of openings 116 arranged in the imaging region 103. If the density of the openings 116 formed in the imaging region 103 is higher than the density of the openings 116 formed in the peripheral region 104 in the viewpoint of one of the number per unit area and the ratio of the area, the configuration is included in the embodiment of the invention.

In FIG. 1C, a first waveguide member 118 is formed in the openings 116 and on the fifth interlayer insulating film 113e. More specifically, the first waveguide member 118 is formed in the imaging region 103 and the peripheral region 104. The first waveguide member 118 may be formed by film deposition through chemical vapor deposition (CVD) or sputtering, or by providing coating with an organic material represented by a polyimide-based polymer. Alternatively, the first waveguide member 118 may be formed in a plurality of steps under different conditions. For example, in a first step, the first waveguide member 118 may be formed under a condition that increases adhesion to an under layer, and in a second step, the first waveguide member 118 may be formed under a condition that improves embedment in the openings 116. Still alternatively, the first waveguide member 118 may be formed by successively forming a plurality of different materials. For example, the first waveguide member 118 may be formed by depositing a silicon nitride film first, then depositing an organic material with a good embedment characteristic. Also, in the step of FIG. 1B, if the first interlayer insulating film 113a is etched until the etch-stop member 117 is exposed, the first waveguide member 118 is arranged to contact the etch-stop member 117.

The material of the first waveguide member 118 may be a material with a higher refractive index than the refractive index of the interlayer insulating films 113a to 113e. If the interlayer insulating films 113a to 113e are silicon oxide films, the material of the first waveguide member 118 may be a silicon nitride film or a polyimide-based organic material. The silicon nitride film has a refractive index in a range from 1.7 to 2.3. The peripheral silicon oxide film has a refractive index in a range from 1.4 to 1.6. Hence, based on the Snell laws of refraction, light incident on the interface between the first waveguide member 118 and the interlayer insulating films 113a to 113e is reflected. Accordingly, the light can be trapped in the first waveguide member 118. Also, the hydrogen content of the silicon nitride film can be increased, and dangling bond of the substrate can be terminated by a hydrogen supply effect. Accordingly, a noise such as a white flaw may be reduced. The polyimide-based organic material has a refractive index of about 1.7. The embedment characteristic of the polyimide-based organic material is better than that of the silicon nitride film. The material of the first waveguide member 118 may be properly determined with regard to tradeoffs between optical characteristics such as a refractive index difference and advantages of the manufacturing step.

Now, the positional relationship between the plurality of interlayer insulating films 113a to 113e and the first waveguide member 118 arranged in the openings 116 is described. In a plan, a region, where the first waveguide member 118 is arranged, is surrounded by or sandwiched between regions, where the plurality of interlayer insulating films 113a to 113e are arranged. In other words, a first part of the plurality of interlayer insulating films 113a to 113e, a second part different from the first part, and the first waveguide member 118 are arranged along a direction intersecting with a direction in which the photoelectric conversion portions 105 and the first waveguide member 118 arranged in the openings 116 are arranged. The direction intersecting with the direction in which the photoelectric conversion portions 105 and the first waveguide member 118 arranged in the openings 116 are arranged, is, for example, a direction parallel to the principal surface 102 of the semiconductor substrate 101.

The first waveguide member 118 is arranged at a position at which the first waveguide member 118 is superposed on the photoelectric conversion portion 105 on the semiconductor substrate 101. The plurality of interlayer insulating films 113a to 113e are arranged around the first waveguide member 118. The refractive index of the material forming the first waveguide member 118 may be higher than the refractive index of the plurality of interlayer insulating films 113a to 113e. With such a relationship between the refractive indices, the quantity of light leaking to the plurality of interlayer insulating films 113a to 113e from among light incident on the first waveguide member 118 can be reduced. Accordingly, if at least a portion of the first waveguide member 118 is arranged to be superposed on the photoelectric conversion portion 105, the quantity of light incident on the photoelectric conversion portion 105 can be increased.

The refractive index of the first waveguide member 118; however, does not have to be necessarily higher than that of the plurality of interlayer insulating films 113a to 113e. As long as a configuration inhibits the light incident on the first waveguide member 118 from leaking to the peripheral insulator, the configuration functions as an optical waveguide. For example, a member that reflects light may be arranged at a side wall of the opening 116, and the first waveguide member 118 may be embedded in the other part of the opening 116. Also, an air gap may be provided between the first waveguide member 118 arranged in the opening 116 and the plurality of interlayer insulating films 113a to 113e. The air gap may be in a vacuum or may be arranged with gas. In these cases, the refractive index of the material forming the first waveguide member 118 and the refractive index of the material forming the plurality of interlayer insulating films 113a to 113e may have any relationship.

Then, as shown in FIG. 2A, a part of the first waveguide member 118 arranged in the peripheral region 104 is removed. First, an etching mask (not shown) is laminated on the first waveguide member 118. The etching mask has an opening at the position of the peripheral region 104. Then, the part of the first waveguide member 118 arranged in the peripheral region 104 is removed by etching.

At this time, the part of the first waveguide member 118 arranged in the peripheral region 104 may be etched so as to remain by a predetermined film thickness. Since the first waveguide member 118 is present in the peripheral region 104 by the predetermined film thickness, damage applied to the semiconductor substrate by etching can be reduced. Of course, the first waveguide member 118 may be removed until the part of the fifth interlayer insulating film 113e arranged in the peripheral region 104 is exposed.

In this embodiment, the entire part of the first waveguide member 118 arranged in the peripheral region 104 is etched. In other words, the etching mask is not arranged in the peripheral region 104. As long as the area of the part to be etched is large, flatness can be increased. However, only a portion of the part arranged in the peripheral region 104 may be etched. The area mentioned here is an area in a plan.

Also, the method of removing the part of the first waveguide member 118 arranged in the peripheral region 104 is not limited to etching. For example, a portion of the first waveguide member 118 may be removed by lift-off. More specifically, before the first waveguide member 118 is formed, an under layer film is formed in the peripheral region 104. If the under layer film is removed after the first waveguide member 118 is formed, the first waveguide member 118 arranged on the under layer film is simultaneously removed.

In this step, a portion of the first waveguide member 118 arranged in the imaging region 103 may be removed.

In a step of FIG. 2B, a surface of the first waveguide member 118 at the side opposite to the semiconductor substrate 101 is planarized. The first waveguide member 118 is planarized by, for example, CMP, physical grinding, or etching. In this embodiment, the planarization is performed by CMP.

In the step of FIG. 2B, the surface of the first waveguide member 118 at the side opposite to the semiconductor substrate 101 does not have to be completely flat. Only a step at the surface of the first waveguide member 118 at the side opposite to the semiconductor substrate 101 before the planarization may be reduced by the step of planarization. For example, in the peripheral region 104, the first waveguide member 118 after the planarization may have a film thickness in a range from 200 to 500 nm. Also, in a region, where the opening 116 is not arranged in the imaging region 103, the first waveguide member 118 after the planarization may have a film thickness in a range from 50 to 350 nm.

In this embodiment, when the step of planarization is performed, the surface of the first waveguide member 118 at the side opposite to the semiconductor substrate 101 is exposed. Hence, the exposed surface of the first waveguide member 118 arranged in the imaging region 103 and the exposed surface of the first waveguide member 118 arranged in the peripheral region 104 are planarized. If another member is formed on the first waveguide member 118, an exposed surface of that member is planarized. Alternatively, if the first waveguide member 118 is removed until the fifth interlayer insulating film 113e, which is an under layer, is exposed, in the step in FIG. 2A, the exposed surface of the first waveguide member arranged in the imaging region 103 and the exposed surface of the fifth interlayer insulating film 113e are planarized.

The planarization in this step may be made so that a step between the exposed surface in the imaging region 103 and the exposed surface in the peripheral region 104 is reduced. Alternatively, the exposed surface in the imaging region 103 may be planarized within the plane and the exposed surface in the peripheral region 104 may be planarized within the plane.

Figure 2C:
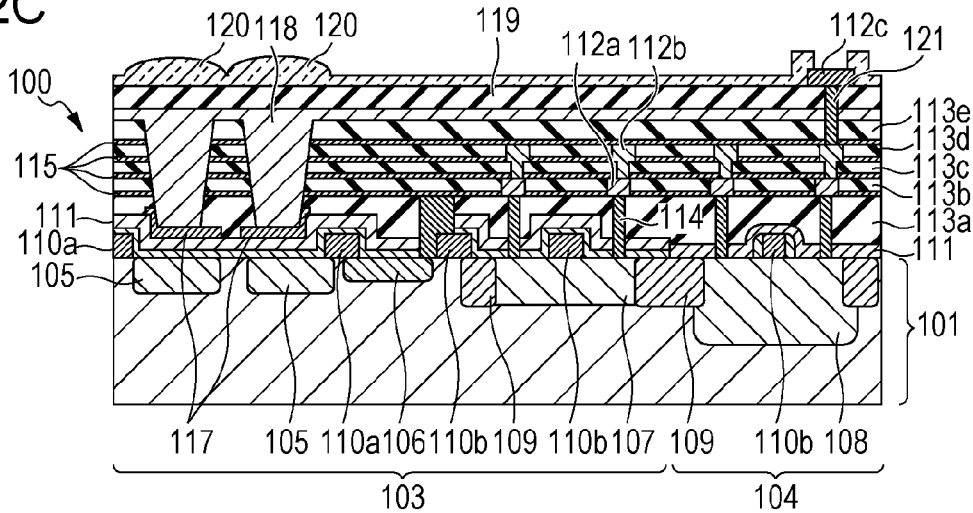

Then, in a step of FIG. 2C, a sixth interlayer insulating film 119, a third wiring layer 112c, and an interlayer lens 120 are formed. First, the sixth interlayer insulating film 119 is formed on the first waveguide member 118. The refractive index of the sixth interlayer insulating film 119 differs from the refractive index of the first waveguide member 118. The sixth interlayer insulating film 119 may be formed of the same material as the material of the fifth interlayer insulating film 113e. In this embodiment, the sixth interlayer insulating film 119 is a silicon oxide film. The sixth interlayer insulating film 119 may be formed by CVD. Since the sixth interlayer insulating film 119 is formed by CVD, the sixth interlayer insulating film 119 may be formed by a substantially uniform film thickness in the imaging region 103. However, the forming method is not limited to CVD, and the sixth interlayer insulating film 119 may be formed by a method of forming a film with a substantially uniform film thickness. More specifically, for example, the sixth interlayer insulating film 119 may be formed by coating. A silicon oxide film may be formed by providing coating with a material through, for example, spin on glass (SOG), then providing heat treatment.

Then, a through-hole is formed in the fifth interlayer insulating film 113e, the first waveguide member 118, and the sixth interlayer insulating film 119. A plug 121 is formed in the formed through-hole. The plug 121 electrically connects a predetermined conductive member of the second wiring layer 112b with a predetermined conductive member of the third wiring layer 112c. To form the plug 121, first, a metal film is formed on the semiconductor substrate by a method, such as sputtering, CVD, vapor deposition, or plating. Then, the metal film is removed except for a part arranged inside the through-hole by a method, such as etching, CMP, or physical grinding. In this embodiment, the metal film is formed by CVD, and then CMP is performed on the metal film. The plug 121 contains, for example, tungsten.

Then, the third wiring layer 112c is formed. In this embodiment, the conductive member of the third wiring layer 112c contains an alloy of aluminum and copper. The method of forming the third wiring layer 112c may use the method described above as the method of forming the first wiring layer 112a or the second wiring layer 112b.

Then, the interlayer lens 120 is formed. The interlayer lens 120 is arranged to correspond to the photoelectric conversion portion 105. The interlayer lens 120 is formed of, for example, a silicon nitride film. The method of forming the interlayer lens 120 may use a known method. Then, a color filter, a micro lens, etc., are formed on the interlayer lens 120 at the side opposite to the semiconductor substrate 101 if required.

In this embodiment, in the step shown in FIG. 2C, in a period after the sixth interlayer insulating film 119 is formed and before the through-hole is formed in the sixth interlayer insulating film 119, planarization with physical grinding such as CMP is not performed on the sixth interlayer insulating film 119. Accordingly, a variation in sensitivity can be reduced. As it has been known, the inventors have noticed that the variation in sensitivity could be reduced by increasing flatness. However, the inventors now obtains a new finding that the variation in sensitivity can be reduced by intentionally skipping planarization with physical grinding such as CMP after the sixth interlayer insulating film 119 is formed in this embodiment. This point is described below in detail.

In this embodiment, the first waveguide member 118 is arranged to be embedded in the plurality of openings 116 arranged in the imaging region 103, and the sixth interlayer insulating film 119 is arranged on the first waveguide member 118. In this case, if CMP is performed on the sixth interlayer insulating film 119, a variation in film thickness of the sixth interlayer insulating film 119 in the imaging region 103 may be increased. This problem may occur if the under layer of the sixth interlayer insulating film 119, that is, the exposed surface before the sixth interlayer insulating film 119 is formed is not completely flat. In this embodiment, the first waveguide member 118, which is the under layer of the sixth interlayer insulating film 119, is formed to be embedded in the plurality of openings 116. Hence, even if the step of planarization is performed on the first waveguide member 118 as shown in FIG. 2B, flatness may not be sufficient within the plane of the imaging region 103. If CMP is performed on the sixth interlayer insulating film 119, and if the flatness of the upper surface of the sixth interlayer insulating film 119 is higher than the flatness of the under layer, the film thickness of the sixth interlayer insulating film 119 may differ depending on the position.

The refractive index of the sixth interlayer insulating film 119 differs from the refractive index of the member arranged below the sixth interlayer insulating film 119. In this embodiment, the member arranged below the sixth interlayer insulating film 119 is the first waveguide member 118. That is, the refractive index of the sixth interlayer insulating film 119 differs from the refractive index of the first waveguide member 118. Hence, multireflection of incident light may occur at the interface of the sixth interlayer insulating film 119 at the side of the semiconductor substrate 101 and at the interface of the sixth interlayer insulating film 119 at the side opposite to the semiconductor substrate 101. If the multireflection occurs, the quantity of light transmitted through the sixth interlayer insulating film 119 and being incident on the first waveguide member 118 depends on the film thickness of the sixth interlayer insulating film 119. Accordingly, if the sixth interlayer insulating film 119 has different film thicknesses at the parts respectively arranged on the photoelectric conversion portions 105, the quantities of light incident on the photoelectric conversion portions 105 differ from each other. That is, the sensitivity may vary among the plurality of photoelectric conversion portions 105.

Hence, in this embodiment, after the sixth interlayer insulating film 119 is formed, the planarization with grinding such as CMP is not performed on the sixth interlayer insulating film 119. Accordingly, the film thickness when the sixth interlayer insulating film 119 is formed can be held, and the variation in film thickness of the sixth interlayer insulating film 119 in the imaging region 103 can be reduced. As the result, the variation in sensitivity can be reduced.

In a period after the sixth interlayer insulating film 119 is formed and before another layer is formed on the sixth interlayer insulating film, the planarization with grinding such as CMP may not be performed on the sixth interlayer insulating film 119. Alternatively, after the sixth interlayer insulating film 119 is formed, the planarization with grinding such as CMP may not be performed at all. Still alternatively, if another member is arranged on the sixth interlayer insulating film 119, the planarization with grinding such as CMP may not be performed on the member arranged on the sixth interlayer insulating film 119.

If the planarization with grinding such as CMP is not performed, processing of uniformly changing the film thickness in the entire surface, such as etching, may be performed on the sixth interlayer insulating film 119. Alternatively, the planarization with grinding such as CMP may not be performed, and also the processing of changing the film thickness of the sixth interlayer insulating film 119 may not be performed. That is, after the sixth interlayer insulating film 119 is formed, without other processing, the through-hole may be formed in or another film may be formed on the sixth interlayer insulating film 119.

Figure 6A:
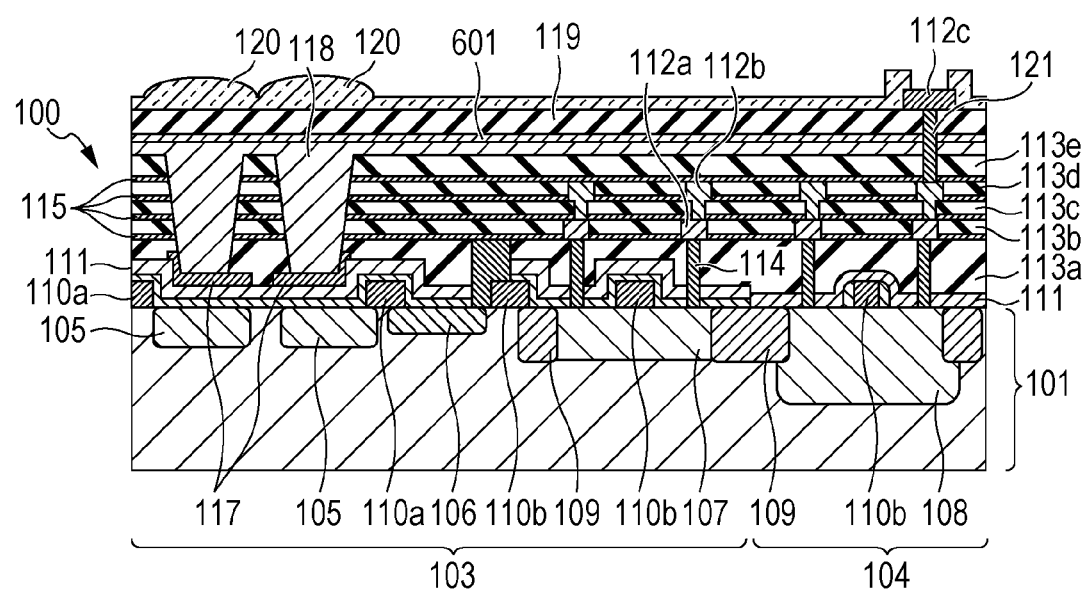
FIGS. 6A and 6B are illustrations showing the manufacturing methods of the solid-state imaging devices according to the first embodiment and the modification of the first embodiment.

Also, as shown in FIG. 6A, a film 601 may be provided between the first waveguide member 118 and the sixth interlayer insulating film 119. The film 601 has a refractive index of an intermediate value between the refractive indices of the first waveguide member 118 and sixth interlayer insulating film 119. The film 601 having the intermediate refractive index is, for example, a silicon oxynitride film. A step of forming the film 601 having the intermediate refractive index is performed after the step of planarizing the first waveguide member 118 as shown in FIG. 2B, and before the sixth interlayer insulating film 119 is formed.

Figure 3:
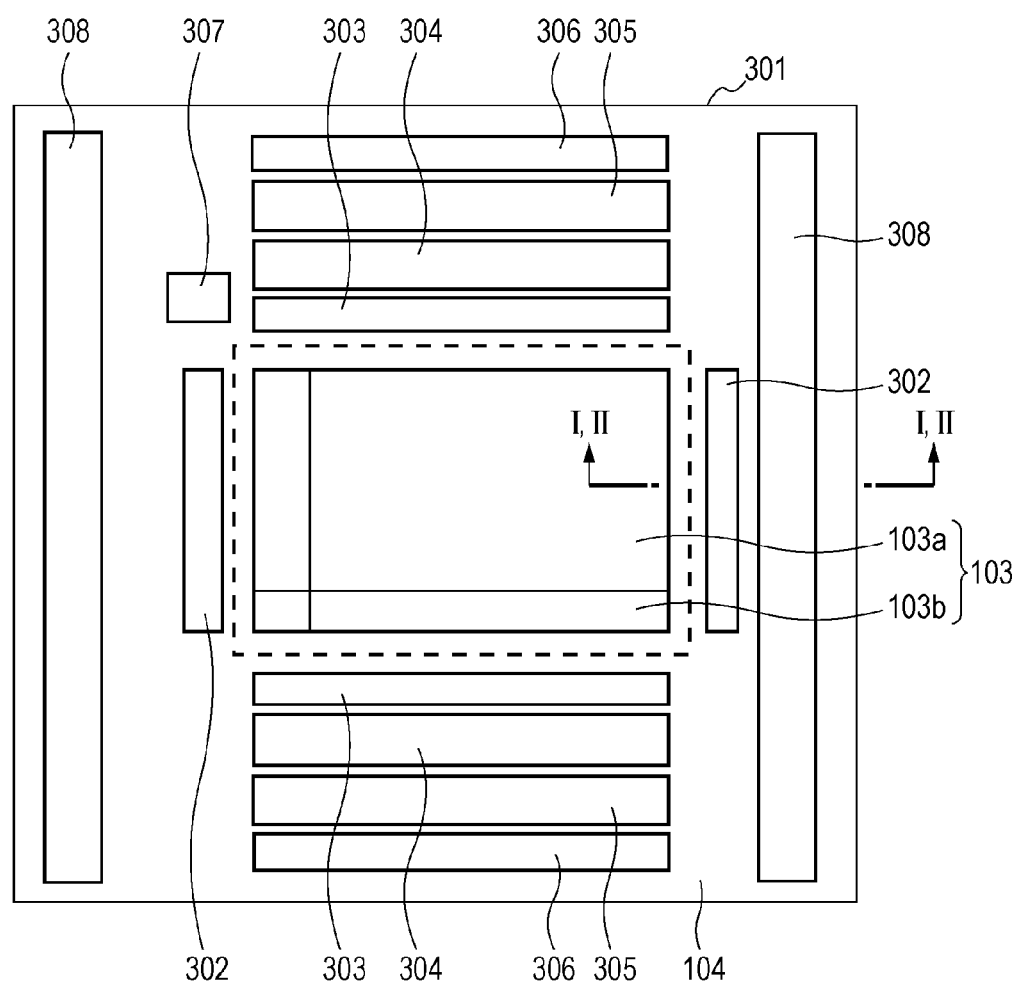
FIG. 3 is a schematic illustration of a planar structure of the solid-state imaging device according to the first embodiment.

FIG. 3 is a schematic illustration showing a planar structure of the solid-state imaging device of this embodiment. Cross sections taken along line I-I and line II-II in FIG. 3 are shown in FIGS. 1A to 2C.

In FIG. 3, the solid-state imaging device 100 includes the imaging region 103 and the peripheral region 104. The imaging region 103 may further include a light receiving region 103a and a light shielding region 103b. The imaging region 103 has a plurality of pixels two-dimensionally arranged therein. Photoelectric conversion portions of the pixels arranged in the light shielding region 103b are shielded from light. A signal from such a pixel can be used as a black level reference. The imaging region 103 may be, for example, a rectangular region which may contain all the plurality of photoelectric conversion portions 105 arranged on the semiconductor substrate 101. The boundary of the imaging region 103 may serve as an element isolation portion arranged between the photoelectric conversion portions 105 arranged in the outer periphery and an element arranged at the side of the photoelectric conversion portions 105 from among elements constituting a signal processing circuit.

The peripheral region 104 is a region except for the imaging region 103. In this embodiment, a vertical scanning circuit 302, a horizontal scanning circuit 303, a column amplifier 304, a column analog-to-digital converter (a column ADC) 305, a memory 306, a timing generator 307, and a plurality of pads 308 are arranged in the peripheral region 104. These circuits are for processing signals from the pixels. The above-described circuits may not be partly arranged.

In this embodiment, the region, where the first waveguide member 118 is removed, is a region 301 outside a broken line in FIG. 3. As shown in FIG. 3, a major part of the peripheral region 104 may be the region 301.

In this embodiment, when the first waveguide member 118 is formed, the openings 116 are formed in the surface serving as the under layer thereof. The openings 116 are arranged only in the imaging region 103. Alternatively, the density of the openings 116 arranged in the imaging region 103 is higher than the density of the openings arranged in the peripheral region 104. Hence, the first waveguide member 118 is formed by a larger thickness in the region with the few openings 116 as compared with that in the region with the many openings 116. That is, a step is generated between the imaging region 103 (the first region), where the many openings 116 are arranged, and the peripheral region 104 (the second region) with the few openings 116. Accordingly, by removing the part of the first waveguide member 118 arranged in the peripheral region 104, the step can be reduced.

Modification of First Embodiment

Figure 4A:
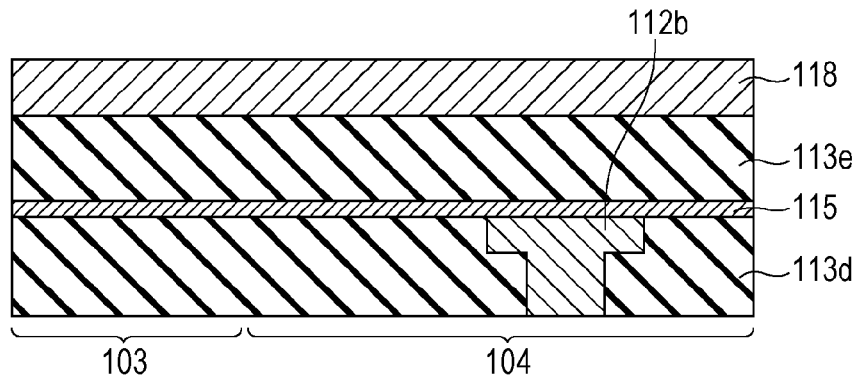
FIGS. 4A to 4C are illustrations showing a manufacturing method of a solid-state imaging device according to a modification of the first embodiment.
Figure 4B:
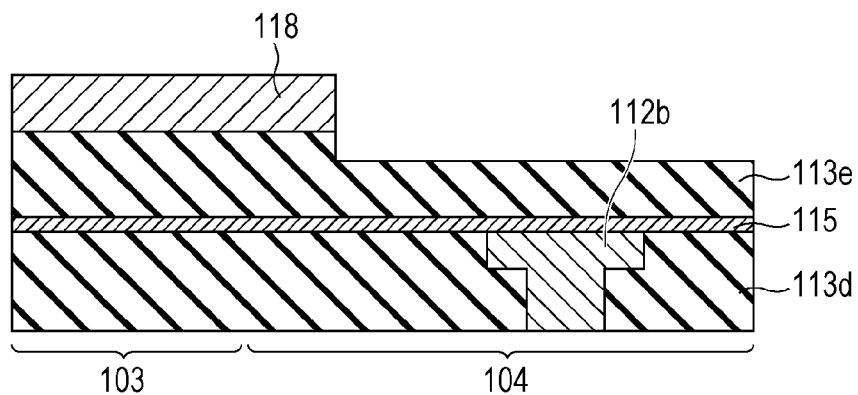
Figure 4C:
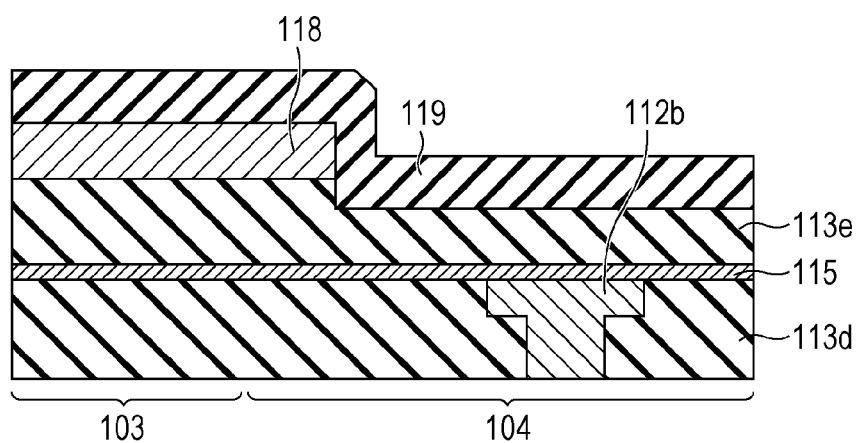

A modification of the first embodiment is described with reference to FIGS. 4A to 4C. In FIGS. 4A to 4C, the same reference signs are applied to the same parts in FIGS. 1A to 2C. FIG. 4A is a partly enlarged view of FIG. 2B. The steps to FIG. 4A in this modification are similar to the steps of the first embodiment shown in FIGS. 1A to 2B. The explanation of FIGS. 1A to 2B is similar to the explanation of the first embodiment, and hence is omitted.

As shown in FIG. 4B, the step of FIG. 2B, or in particular, the step of removing a part of the first waveguide member 118 formed in the peripheral region 104 is performed after the first waveguide member 118 is planarized. Particularly in this step, the first waveguide member 118 arranged at the position of the plug 121, and within a predetermined distance from the position of the plug 121 may be removed. At this time, the first waveguide member 118 is removed until the under layer of the first waveguide member 118 is exposed. In this modification, the under layer of the first waveguide member 118 is the fifth interlayer insulating film 113e.

Then, as shown in FIG. 4C, the sixth interlayer insulating film 119 is formed. The refractive index of the sixth interlayer insulating film 119 differs from the refractive index of the member arranged below the sixth interlayer insulating film 119. In this modification, the member arranged below the sixth interlayer insulating film 119 is the first waveguide member 118. That is, the refractive index of the sixth interlayer insulating film 119 differs from the refractive index of the first waveguide member 118. The sixth interlayer insulating film 119 may be formed of the same material as the material of the fifth interlayer insulating film 113e. In this modification, the sixth interlayer insulating film 119 is a silicon oxide film. The sixth interlayer insulating film 119 may be formed by CVD. Since the sixth interlayer insulating film 119 is formed by CVD, the sixth interlayer insulating film 119 may be formed by a substantially uniform film thickness in the imaging region 103. However, the forming method is not limited to CVD, and the sixth interlayer insulating film 119 may be formed by a method of forming a film with a substantially uniform film thickness. For example, the sixth interlayer insulating film 119 may be formed by coating. More specifically, a silicon oxide film may be formed by providing coating with a material through, for example, spin on glass (SOG), and then providing heat treatment.

Figure 5A:
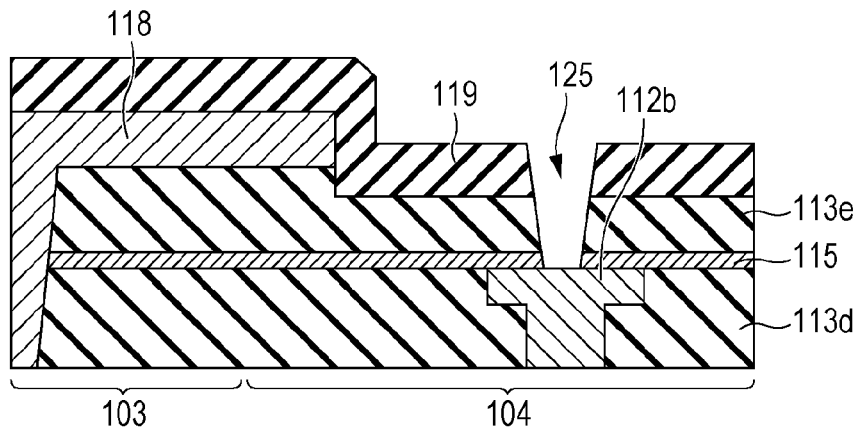
FIGS. 5A to 5C are illustrations showing the manufacturing method of the solid-state imaging device according to the modification of the first embodiment.
Figure 5B:
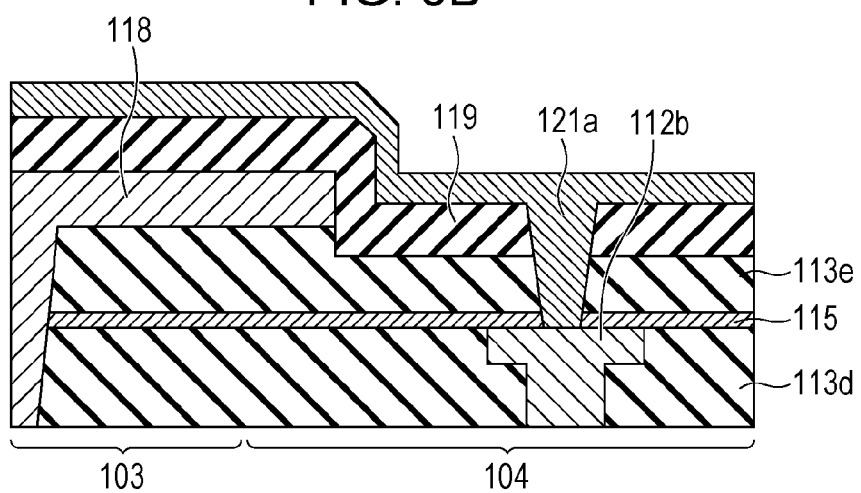

Then, as shown in FIG. 5A, a through-hole 125 for forming the plug 121 is formed. Then, as shown in FIG. 5B, a metal film 121a is formed in the through-hole 125 and on the semiconductor substrate. The metal film 121a contains a material which may be selected from tungsten, copper, aluminum, and an alloy of any of these metals. The metal film 121a is formed by, for example, sputtering, CVD, or plating. In this modification, the metal film 121a contains, for example, tungsten.

Figure 5C:
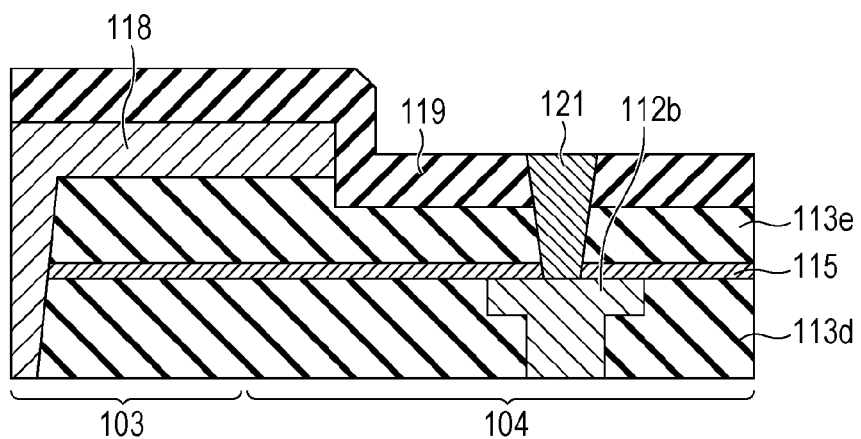

Then, as shown in FIG. 5C, the metal film 121a is removed by etching except for a part of the metal film 121a arranged in the through-hole 125. Accordingly, the plug 121 is formed. In this modification, the plug 121 contains, for example, tungsten.

Thereafter, as shown in FIG. 2C, the third wiring layer 112c and the interlayer lens 120 are formed. These steps are similar to the steps of the first embodiment and hence the explanation is omitted.

With the manufacturing method of this modification, the through-hole 125 for the arrangement of the plug 121 is easily formed. The reason is briefly described. If the first waveguide member 118 is not removed before the sixth interlayer insulating film 119 is formed, the fifth interlayer insulating film 113e, the first waveguide member 118, and the sixth interlayer insulating film 119 are laminated in that order from the side close to the semiconductor substrate 101. Then, to form the through-hole 125, three removing steps (for example, etching) have to be performed under conditions suitable for the respective layers. In contrast, if the first waveguide member 118 is removed and then the sixth interlayer insulating film 119 is formed, the fifth interlayer insulating film 113e and the sixth interlayer insulating film 119 are laminated in that order from the side close to the semiconductor substrate 101 in the region, where the through-hole 125 is to be formed. Since the fifth interlayer insulating film 113e and the sixth interlayer insulating film 119 are formed of the same material, the removing step for forming the through-hole can be performed under a single condition. Hence, the through-hole can be formed by the two removing steps including the removing step of the first waveguide member 118, which is previously performed.

If the first waveguide member 118 is planarized and then the part of the first waveguide member 118 formed in the peripheral region 104 is removed, the step of the under layer on which the sixth interlayer insulating film 119 is formed may likely become large. However, even in this case, after the sixth interlayer insulating film 119 is formed, if the planarization with grinding such as CMP is not performed on the sixth interlayer insulating film 119, the variation in sensitivity can be reduced.

In a period after the sixth interlayer insulating film 119 is formed and before another layer is formed on the sixth interlayer insulating film, the planarization with grinding such as CMP may not be performed on the sixth interlayer insulating film 119. Alternatively, after the sixth interlayer insulating film 119 is formed, the planarization with grinding such as CMP may not be performed at all. Still alternatively, if another member is arranged on the sixth interlayer insulating film 119, the planarization with grinding such as CMP may not be performed on the member arranged on the sixth interlayer insulating film 119.

If the planarization with grinding such as CMP is not performed, processing of uniformly changing the film thickness in the entire surface, such as etching, may be performed on the sixth interlayer insulating film 119. Alternatively, the planarization with grinding such as CMP may not be performed, and also the processing of changing the film thickness of the sixth interlayer insulating film 119 may not be performed. That is, after the sixth interlayer insulating film 119 is formed, without other processing, the through-hole may be formed in or another film may be formed on the sixth interlayer insulating film 119.

Figure 6B:
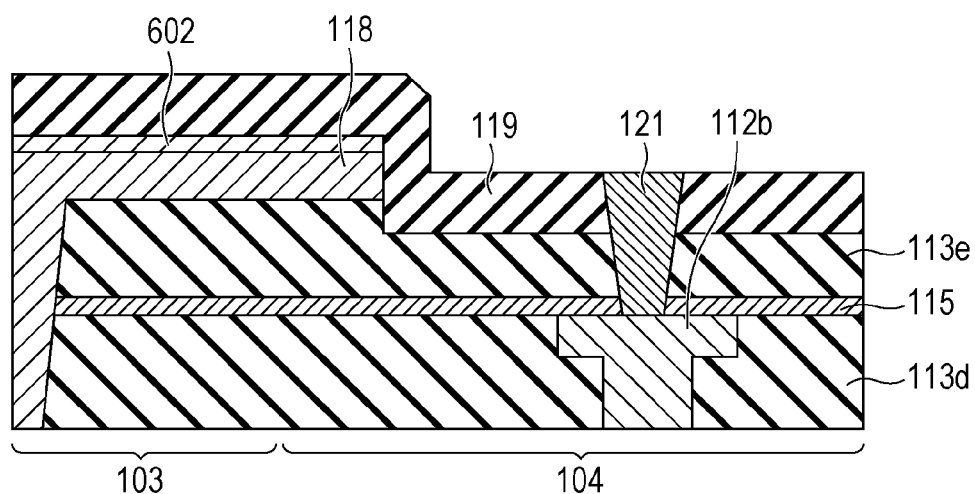

Also, as shown in FIG. 6B, an intermediate film 602 may be provided between the first waveguide member 118 and the sixth interlayer insulating film 119. The film 602 has a refractive index of an intermediate value of the refractive indices of the first waveguide member 118 and sixth interlayer insulating film 119. The intermediate film 602 is, for example, a silicon oxynitride film. A step of forming the intermediate film 602 may be formed after the step of planarizing the first waveguide member 118 shown in FIG. 4A and before the step of removing the first waveguide member 118 shown in FIG. 4B. The intermediate film 602 is formed in the peripheral region 104, and in the step shown in FIG. 4B, a part of the intermediate film 602 arranged in the peripheral region 104 may be removed.

Second Embodiment

A second embodiment of a manufacturing method of a solid-state imaging device according to the invention is described. FIGS. 7A to 7C, 8A to 8C, and 9A to 9C are schematic illustrations of a sectional structure of the solid-state imaging device in respective steps of this embodiment. The same reference signs are applied to parts having similar functions to those in FIGS. 1A to 2C and detailed description is omitted.

Figure 7A:
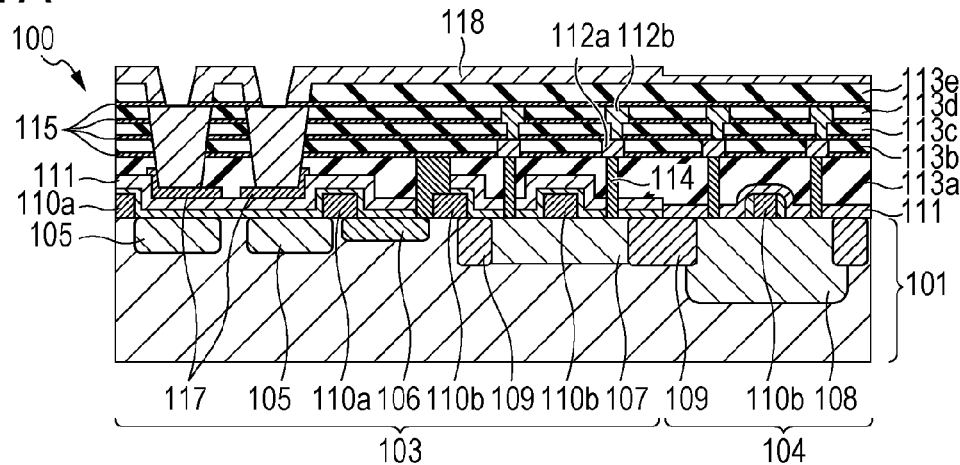
FIGS. 7A to 7C are illustrations showing a manufacturing method of a solid-state imaging device according to a second embodiment.

FIG. 7A shows the same step as the step shown in FIG. 2A of the first embodiment. That is, FIG. 7A shows a state in which a part of the first waveguide member 118 arranged in the peripheral region 104 is removed. The steps to FIG. 7A in the manufacturing method of this embodiment are similar to the steps in FIGS. 1A to 2A of the first embodiment.

Figure 7B:
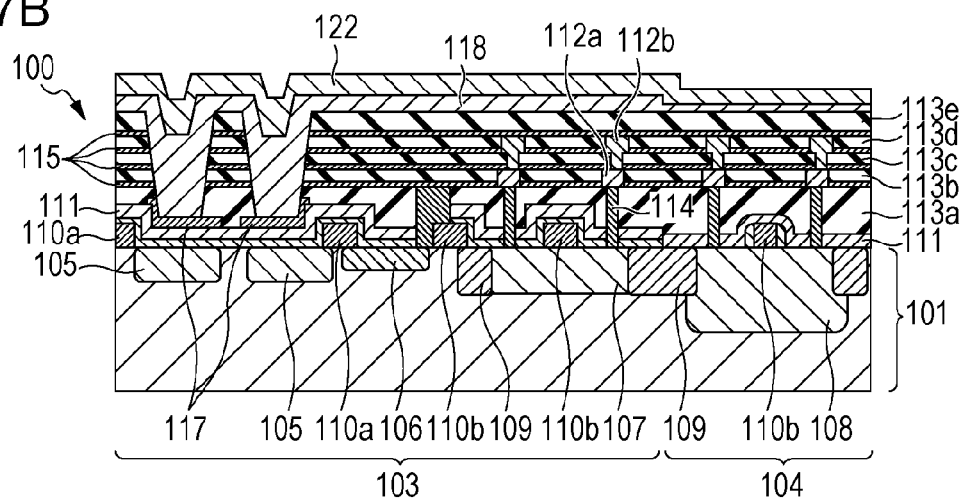

In a step shown in FIG. 7B, a second waveguide member 122 is formed on the first waveguide member 118 at the side opposite to the semiconductor substrate 101. The second waveguide member 122 is formed in the imaging region 103 and the peripheral region 104. In this embodiment, the step of forming the first waveguide member 118 and the step of forming the second waveguide member 122 are different in that a step of removing a part of the first waveguide member 118 arranged in the peripheral region 104 is performed between both steps. Hence, the second waveguide member 122 may be formed of the same material as that of the first waveguide member 118. Alternatively, the second waveguide member 122 may be formed by the same method as the forming method of the first waveguide member 118. Of course, the second waveguide member 122 may be formed of a material different from that of the first waveguide member 118, and the second waveguide member 122 may be formed by a forming method different from the forming method of the first waveguide member 118.

In this embodiment, the first waveguide member 118 and the second waveguide member 122 are formed of the same material. More specifically, the second waveguide member 122 is formed of silicon nitride. In this case, the second waveguide member 122 may be formed by CVD or sputtering. Alternatively, the second waveguide member 122 may be formed by providing coating with an organic material represented by a polyimide-based polymer.

In this embodiment, the first waveguide member 118 and the second waveguide member are formed by CVD. However, process conditions are different between these waveguide members. Alternatively, the second waveguide member 122 may be formed in a plurality of steps under different conditions. Still alternatively, the second waveguide member 122 may be formed by successively forming a plurality of different materials.

Figure 7C:
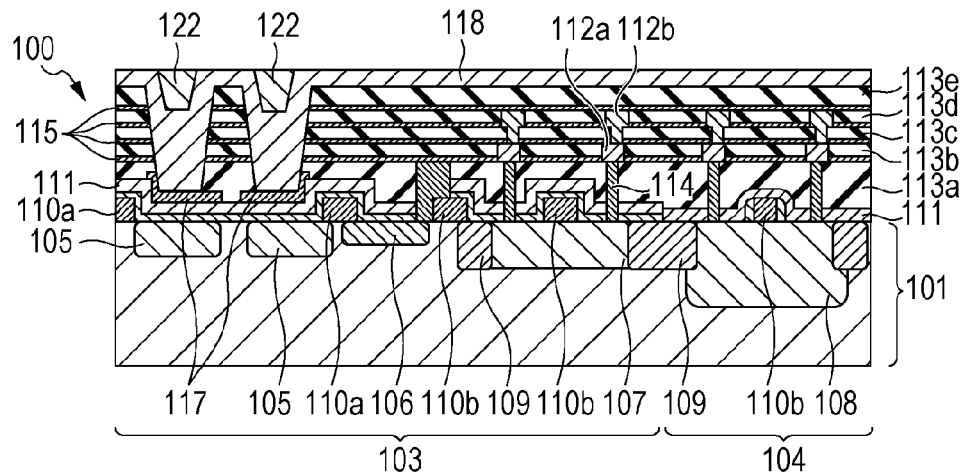

FIG. 7C shows a planarization step after the second waveguide member 122 is formed. In this embodiment, the surface of the second waveguide member 122 at the side opposite to the semiconductor substrate 101 is planarized by CMP. The planarization may be performed by a known method. For example, the planarization may be performed by grinding or etching. As the result of the planarization, the first waveguide member 118 or a member located close to the semiconductor substrate 101 with respect to the second waveguide member may be exposed. In this embodiment, the first waveguide member 118 is exposed in the peripheral region 104. Then, the second waveguide member 122 remains in the imaging region 103. However, the second waveguide member 122 may remain in the peripheral region 104.

In a step of FIG. 7C, the surface of the second waveguide member 122 at the side opposite to the semiconductor substrate 101 does not have to be completely flat. Only a step at the surface of the second waveguide member 122 at the side opposite to the semiconductor substrate 101 before the planarization may be reduced by the step of planarization. For example, the total film thickness of the first waveguide member 118 and the second waveguide member 122 after the planarization in the peripheral region 104 may be in a range from 200 to 500 nm. Also, the total film thickness of the first waveguide member 118 and the second waveguide member 122 after the planarization in the region, where the opening 116 is not formed in the imaging region 103, may be in a range from 50 to 350 nm.

In this embodiment, when the step of planarization is performed, the surface of the second waveguide member 122 at the side opposite to the semiconductor substrate 101 is exposed. If another member is formed on the second waveguide member 122, an exposed surface of that member is planarized.

Figure 8A:
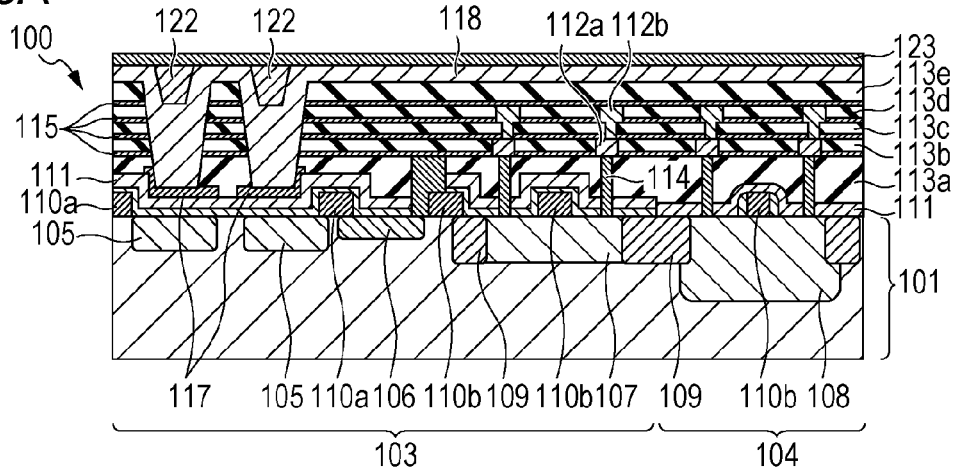
FIGS. 8A to 8C are illustrations showing the manufacturing method of the solid-state imaging device according to the second embodiment.

In a step of FIG. 8A, a low-refractive-index member 123 is formed. The refractive index of the low-refractive-index member 123 is lower than the refractive index of a member arranged at the side close to the semiconductor substrate 101 with respect to the low-refractive-index member 123 and arranged in contact with the low-refractive-index member 123. The member arranged at the side close to the semiconductor substrate 101 with respect to the low-refractive-index member 123 and arranged in contact with the low-refractive-index member 123 is, for example, a member that is exposed at a timing before the low-refractive-index member 123 is formed. In this embodiment, the first waveguide member 118 and the second waveguide member 122 correspond to that member. In particular, in this embodiment, the refractive index of the low-refractive-index member 123 is lower than the refractive indices of the first waveguide member 118 and the second waveguide member 122. More specifically, the low-refractive-index member 123 is formed of a silicon oxynitride film. The silicon oxynitride film has a refractive index of about 1.72. However, the low-refractive-index member 123 does not have to be necessarily provided. If the low-refractive-index member 123 is not provided, the step of FIG. 8A may be omitted.

Figure 8B:
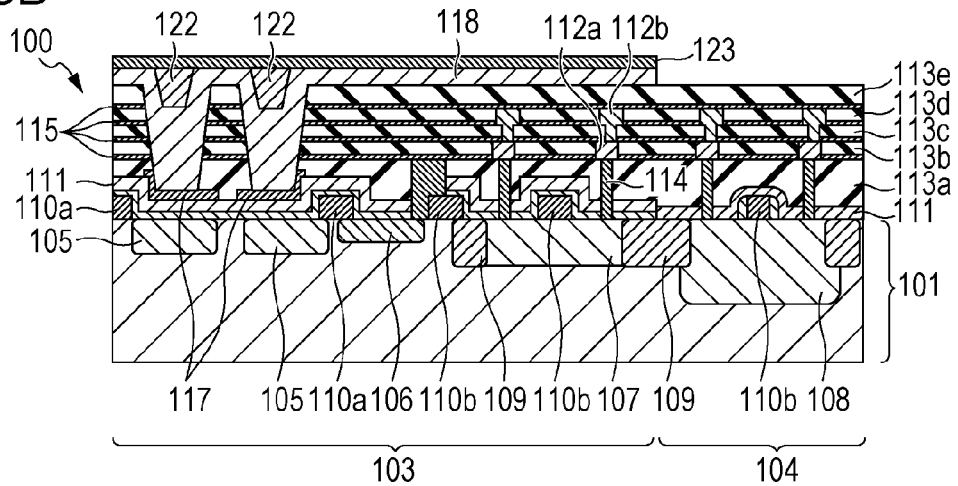

In a step of FIG. 8B, a part of the first waveguide member 118 formed in the peripheral region 104, a part of the second waveguide member 122 formed in the peripheral region 104, or both is removed. Particularly in this step, the first waveguide member 118 and the second waveguide member 122 arranged at the position of the plug 121 (described later), and within a predetermined distance from the position of the plug 121 may be removed. Also, if the low-refractive-index member 123 is arranged, a part of the low-refractive-index member 123 arranged in the peripheral region 104 is removed. At this time, the first waveguide member 118 is removed until the under layer of the first waveguide member 118 is exposed. In this embodiment, the under layer of the first waveguide member 118 is the fifth interlayer insulating film 113e.

Depending on the steps before this step, any of the first waveguide member 118 and the second waveguide member 122 may not be arranged in the peripheral region 104. In this case, any of the first waveguide member 118 and the second waveguide member 122 arranged in the peripheral region 104 is removed.

The removing method may use a known method. For example, in this embodiment, a part of the first waveguide member 118, a part of the second waveguide member 122, and a part of the low-refractive-index member 123 formed in the peripheral region 104 are removed.

Figure 8C:
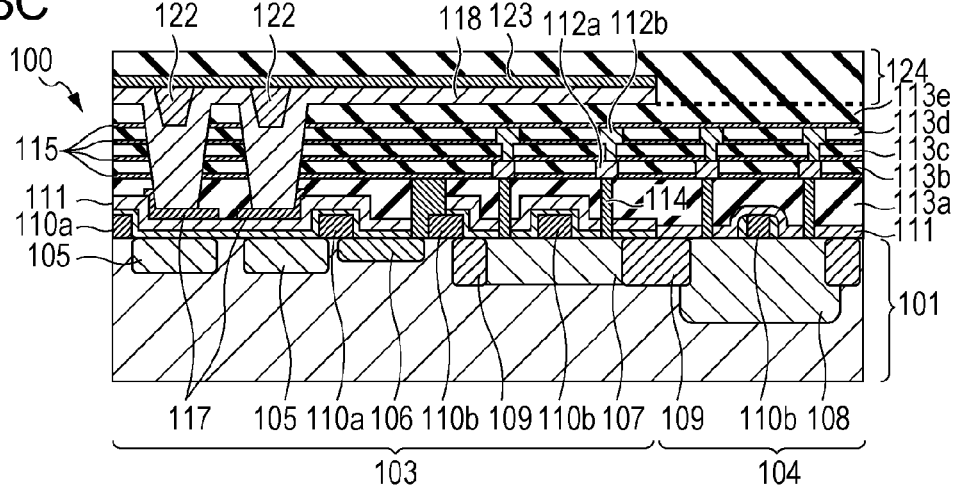

In a step of FIG. 8C, a seventh interlayer insulating film 124 is formed. The seventh interlayer insulating film 124 may be formed of the same material as the material of the fifth interlayer insulating film 113e. If required, a surface of the seventh interlayer insulating film 124 at the side opposite to the semiconductor substrate 101 may be planarized. In this embodiment, the seventh interlayer insulating film 124 is a silicon oxynitride film. The seventh interlayer insulating film 124 may be formed by CVD. Since the seventh interlayer insulating film 124 is formed by CVD, the seventh interlayer insulating film 124 may be formed by a substantially uniform film thickness in the imaging region 103. However, the method of forming the seventh interlayer insulating film 124 is not limited to CVD. The seventh interlayer insulating film 124 may be formed by a method of forming a film with a substantially uniform film thickness. For example, the seventh interlayer insulating film 124 may be formed by coating. More specifically, a silicon oxide film may be formed by providing coating with a material through, for example, spin on glass (SOG), and then providing heat treatment.

With the steps shown in FIGS. 8B and 8C, the through-hole 125 for the arrangement of the plug 121 is easily formed. The reason is briefly described. If the first waveguide member 118, the second waveguide member 122, and the low-refractive-index member 123 are not removed before the seventh interlayer insulating film 124 is formed, the first waveguide member 118, the second waveguide member 122, and the low-refractive-index member 123 are arranged between the fifth interlayer insulating film 113e and the seventh interlayer insulating film 124. Then, to form the through-hole 125, a removing step (for example, etching) have to be performed under conditions suitable for the respective layers. In contrast, if the first waveguide member 118, the second waveguide member 122, and the low-refractive-index member 123 are removed before the seventh interlayer insulating film 124 is formed, and then the seventh interlayer insulating film 124 is formed, the fifth interlayer insulating film 113e and the seventh interlayer insulating film 124 are arranged in contact with each other in a region, where the through-hole 125 is to be formed. Since the fifth interlayer insulating film 113e and the seventh interlayer insulating film 124 are formed of the same material, the step of forming the through-hole 125 can be performed by a single process. Hence, the through-hole 125 can be formed by the two removing steps including the removing step of the first waveguide member 118, which is previously performed. Since the through-hole 125 is easily formed as described above, the steps can be facilitated.

Figure 9A:
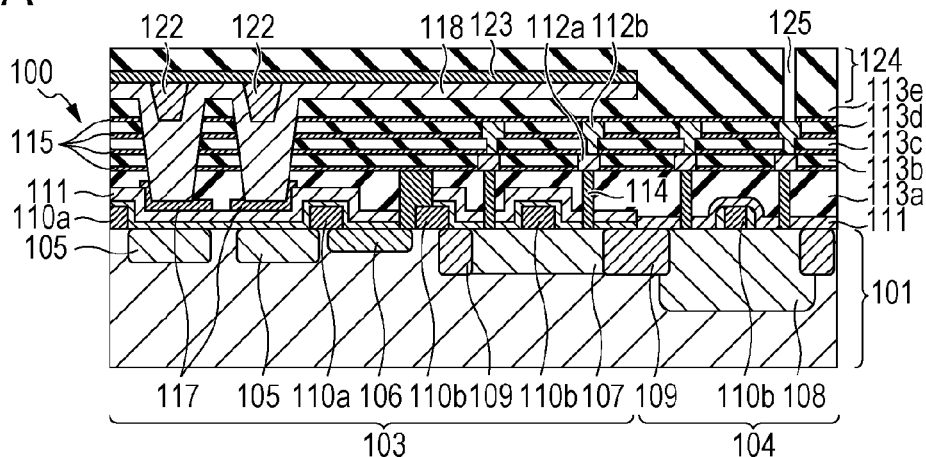
FIGS. 9A to 9C are illustrations showing the manufacturing method of the solid-state imaging device according to the second embodiment.

In a step of FIG. 9A, the through-hole 125 is formed in the seventh interlayer insulating film 124 at a position at which the seventh interlayer insulating film 124 is superposed on a predetermined conductive member of the second wiring layer 112b. The through-hole 125 is formed by, for example, etching.

Figure 9B:
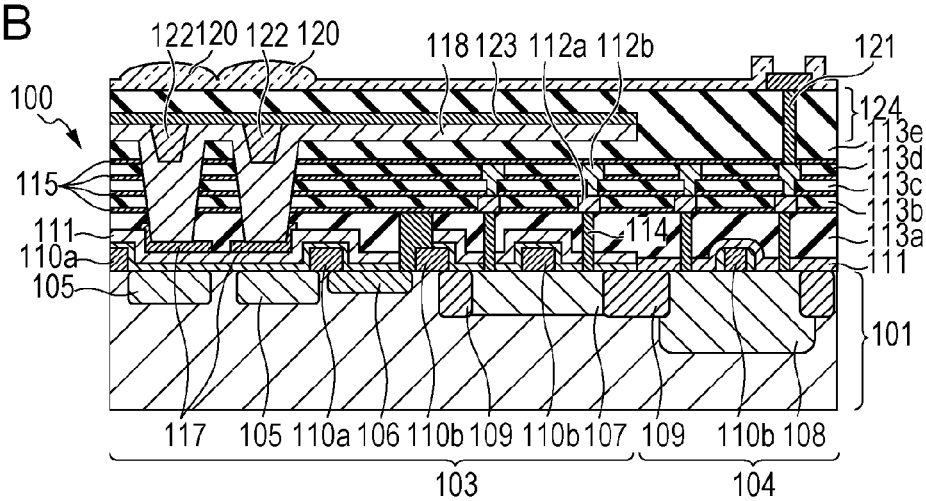

In a step of FIG. 9B, the third wiring layer 112c and the interlayer lens 120 are formed. First, the plug 121 is formed in the through-hole 125. The plug 121 electrically connects a predetermined conductive member of the second wiring layer 112b with a predetermined conductive member of the third wiring layer 112c.

Then, the third wiring layer 112c is formed. In this embodiment, the conductive member of the third wiring layer 112c is formed of aluminum. The method of forming the third wiring layer 112c may properly use the method described above as the method of forming the first wiring layer 112a or the second wiring layer 112b. However, the conductive member of the third wiring layer 112c may be formed of metal other than aluminum.

Also, the interlayer lens 120 is formed in this step. The interlayer lens 120 is arranged to correspond to the photoelectric conversion portion 105. The interlayer lens 120 is formed of, for example, a silicon nitride film. The method of forming the interlayer lens 120 may use a known method. In this embodiment, the material forming the interlayer lens 120 is arranged in the peripheral region 104. However, the material forming the interlayer lens 120 may be arranged only in the imaging region 103.

Also, an intermediate member may be arranged between the interlayer lens 120 and the seventh interlayer insulating film 124. The intermediate member has an intermediate refractive index between the refractive indices of the interlayer lens 120 and the seventh interlayer insulating film 124. In this embodiment, a silicon oxynitride film (not shown) is arranged between the interlayer lens 120 and the seventh interlayer insulating film 124. More specifically, the silicon nitride film (the interlayer lens 120) has a refractive index of about 2.00, the silicon oxynitride film (the intermediate member) has a refractive index of about 1.72, and the silicon oxide film (the seventh interlayer insulating film 124) has a refractive index of about 1.45.

With this configuration, reflectivity can be reduced. This point is briefly described below. In general, when light propagates from a medium with a refractive index n1 to a medium with a refractive index n2, as the difference between n1 and n2 is increased, reflectivity is increased. Since the intermediate member with the intermediate refractive index between the refractive indices of the interlayer lens 120 and the seventh interlayer insulating film 124 is arranged between the interlayer lens 120 and the seventh interlayer insulating film 124, the difference in refractive index at the interface is decreased. As the result, reflectivity when light is incident on the seventh interlayer insulating film 124 from the interlayer lens 120 can be decreased, as compared with a case in which the interlayer lens 120 and the seventh interlayer insulating film 124 are arranged in contact with each other. Similarly, since the low-refractive-index member 123 with the intermediate refractive index between the refractive indices of the seventh interlayer insulating film 124 and the second waveguide member 122 is arranged between the seventh interlayer insulating film 124 and the second waveguide member 122, the difference in refractive index at the interface is decreased. As the result, reflectivity when light is incident on the second waveguide member 122 from the seventh interlayer insulating film 124 can be decreased.

The degree of reduction for reflectivity as the result of the arrangement of the intermediate member varies depending on the relationship among a film thickness d of the intermediate member, a refractive index N of the intermediate member, and a wavelength p of the incident light. This is because multireflection lights from a plurality of interfaces cancel each other. If k is an integer equal to or larger than 0, theoretically, the reflectivity is reduced the most under a condition of Expression (1).

$$d = \frac{p}{4N}(2k+1) \quad (1)$$

That is, theoretically, the reflectivity is reduced the most when the film thickness of the intermediate member is an odd multiple of p/4N. Therefore, the film thickness of the intermediate member may be set based on Expression (1) described above. In particular, the film thickness of the intermediate member preferably satisfies Expression (2). Further, k=0 is the most preferable in Expression (2).

$$\frac{p}{4N}(2k+0.5) < d < \frac{p}{4N}(2k+1.5) \quad (2)$$

For example, it is assumed that the seventh interlayer insulating film 124 has a refractive index of 1.45, the intermediate member has a refractive index of 1.72, the interlayer lens 120 has a refractive index of 2.00, and the incident light has a wavelength of 550 nm. At this time, if the intermediate member has a film thickness of 80 nm, light which is transmitted from the interlayer lens 120 to the seventh interlayer insulating film 124 has a transmittance of about 1.00. In contrast, if the interlayer lens 120 and the seventh interlayer insulating film 124 are arranged in contact with each other, light has a transmittance of about 0.97.

Figure 9C:
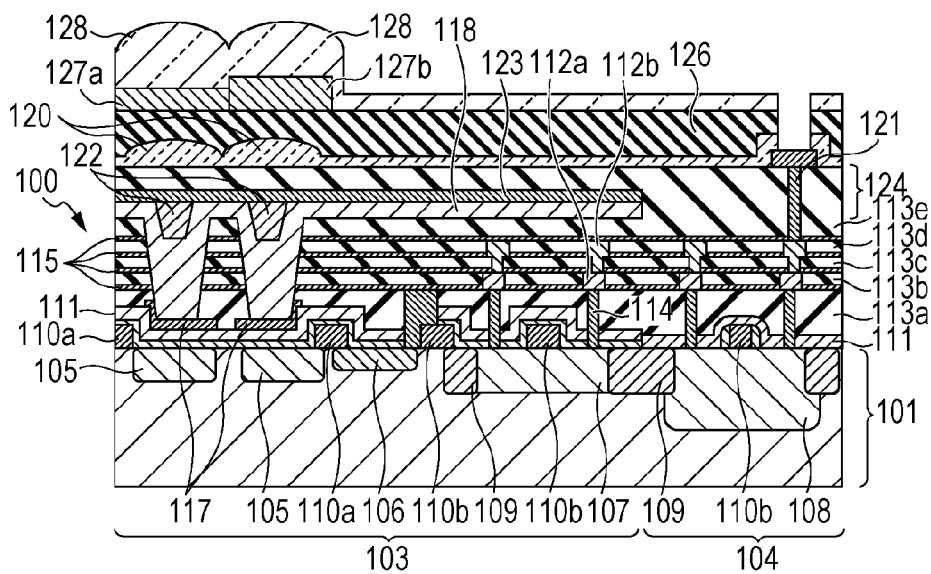

In a step of FIG. 9C, color filters 127a and 127b, and micro lenses 128 are formed. First, an eighth insulating film 126 is formed on the interlayer lens 120 at the side opposite to the semiconductor substrate 101. The eighth insulating film 126 is formed of, for example, an organic material. If required, a surface of the eighth insulating film 126 at the side opposite to the semiconductor substrate 101 may be planarized. For example, by providing coating with an organic material forming the eighth insulating film 126, the eighth insulating film 126 having the planarized surface at the side opposite to the semiconductor substrate 101 can be formed.

Then, the color filters 127a and 127b are formed. The color filters 127a and 127b are arranged to correspond to the photoelectric conversion portion 105. The wavelength of light transmitted through the color filter 127a may differ from the wavelength of light transmitted through the color filter 127b. Then, the micro lenses 128 are formed on the color filters 127a and 127b at the side opposite to the semiconductor substrate 101. The method of forming the micro lenses 128 may use a known method.

With the manufacturing method of this embodiment, the first waveguide member 118 can be easily planarized after the first waveguide member 118 is formed. Hence, when the interlayer lens 120, the color filter 127, or the micro lens 128 is formed, such a member can be formed on the under layer with high flatness. Accordingly, the interlayer lens 120, the color filter 127, or the micro lens 128 can be formed with high accuracy. As the result, image quality can be increased.

In the second embodiment, the second waveguide member 122 is formed, and then the step of planarization shown in FIG. 7C is performed. However, the planarization may be performed after the step of FIG. 7A, and then the second waveguide member 122 may be formed.

Modification of Second Embodiment

Figure 10A:
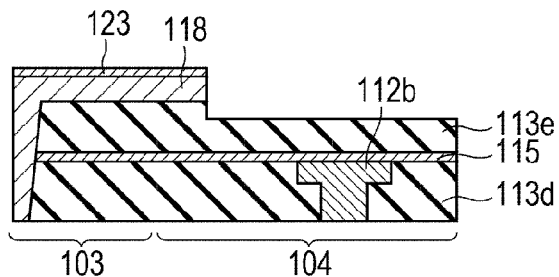
FIGS. 10A to 10E are illustrations showing a manufacturing method of a solid-state imaging device according to a modification of the second embodiment.

A modification of the second embodiment is described with reference to FIGS. 10A to 10E. In FIGS. 10A to 10E, the same reference signs are applied to the same parts in FIGS. 7A to 9C. FIG. 10A is a partly enlarged view of FIG. 8B. The steps to FIG. 10A in this modification are similar to the steps of the second embodiment shown in FIGS. 7A to 8B. The explanation of FIGS. 7A to 8B is similar to the explanation of the second embodiment, and hence is omitted.

Figure 10B:
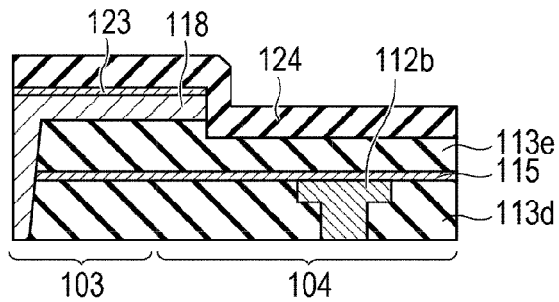

Then, as shown in FIG. 10B, the seventh interlayer insulating film 124 is formed. The refractive index of the seventh interlayer insulating film 124 differs from the refractive index of the member arranged below the seventh interlayer insulating film 124. In this modification, the member arranged below the seventh interlayer insulating film 124 is the low-refractive-index member 123. That is, the refractive index of the seventh interlayer insulating film 124 differs from the refractive index of the low-refractive-index member 123. The refractive index of the seventh interlayer insulating film 124 may differ from the refractive index of the first waveguide member 118. The seventh interlayer insulating film 124 may be formed of the same material as the material of the fifth interlayer insulating film 113e. In this modification, the seventh interlayer insulating film 124 is a silicon oxynitride film. The seventh interlayer insulating film 124 may be formed by CVD. Since the seventh interlayer insulating film 124 is formed by CVD, the seventh interlayer insulating film 124 may be formed by a substantially uniform film thickness in the imaging region 103. However, the method of forming the seventh interlayer insulating film 124 is not limited to CVD. The seventh interlayer insulating film 124 may be formed by a method of forming a film with a substantially uniform film thickness. For example, the seventh interlayer insulating film 124 may be formed by coating. More specifically, a silicon oxide film may be formed by providing coating with a material through, for example, spin on glass (SOG), and then providing heat treatment.

Figure 10C:
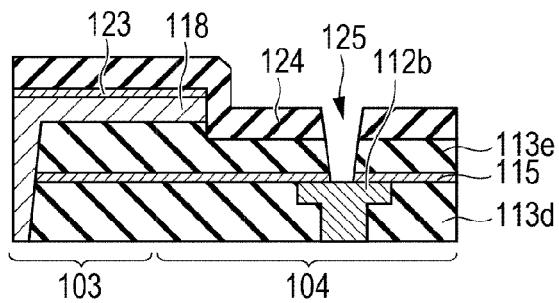
Figure 10D:
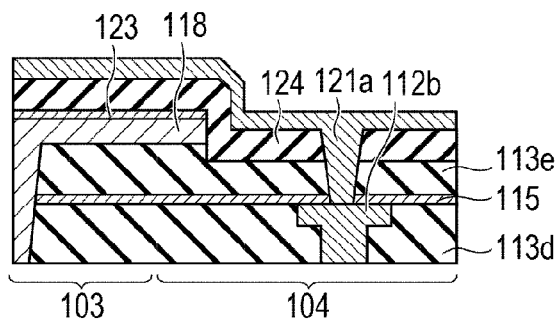

Then, as shown in FIG. 10C, the through-hole 125 for forming the plug 121 is formed. Then, as shown in FIG. 10D, the metal film 121a is formed in the through-hole 125 and on the semiconductor substrate. The metal film 121a contains a material which may be selected from tungsten, copper, aluminum, and an alloy of any of these metals. The metal film 121a is formed by, for example, sputtering, CVD, or plating. In this modification, the metal film 121a contains, for example, tungsten.

Figure 10E:
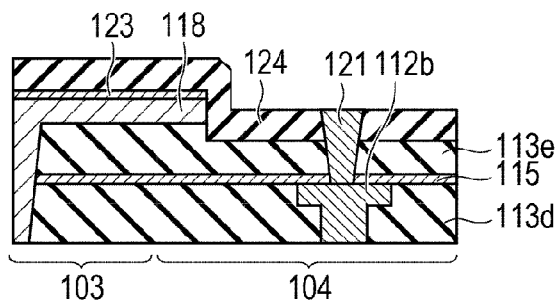

Then, as shown in FIG. 10E, the metal film 121a is removed by etching except for a part of the metal film 121a arranged in the through-hole 125. Accordingly, the plug 121 is formed. In this modification, the plug 121 contains, for example, tungsten.

Thereafter, as shown in FIG. 9B, the third wiring layer 112c and the interlayer lens 120 are formed. Further, an intermediate member may be formed between the interlayer lens 120 and the seventh interlayer insulating film 124. The intermediate member has an intermediate refractive index between the refractive indices of the interlayer lens 120 and the seventh interlayer insulating film 124. In the step of FIG. 9C, the color filters 127a and 127b, and the micro lenses 128 are formed. These steps are similar to the steps of the second embodiment and hence the explanation is omitted.

With the manufacturing method of this modification, the through-hole 125 for the arrangement of the plug 121 is easily formed. The reason is briefly described. If the first waveguide member 118 or the low-refractive-index member 123 is not removed before the seventh interlayer insulating film 124 is formed, the fifth interlayer insulating film 113e, the first waveguide member 118, the low-refractive-index member 123, and the seventh interlayer insulating film 124 are laminated in that order from the side close to the semiconductor substrate 101. Then, to form the through-hole 125, three or four removing steps (for example, etching) have to be performed under conditions suitable for the respective layers. In contrast, if the first waveguide member 118 and the low-refractive-index member 123 are removed and then the seventh interlayer insulating film 124 is formed, the fifth interlayer insulating film 113e and the seventh interlayer insulating film 124 are laminated in that order from the side close to the semiconductor substrate 101 in the region, where the through-hole 125 is to be formed. Since the fifth interlayer insulating film 113e and the seventh interlayer insulating film 124 are formed of the same material, the removing step for forming the through-hole can be performed under a single condition. Hence, the through-hole can be formed by the two to three removing steps including the removing step of the first waveguide member 118, which is previously performed.

If the part of the first waveguide member 118 formed in the peripheral region 104 and the part of the low-refractive-index member 123 formed in the peripheral region 104 are removed, a step of the under layer formed below the seventh interlayer insulating film 124 may be likely increased. However, even in this case, after the seventh interlayer insulating film 124 is formed, if the planarization with grinding such as CMP is not performed on the seventh interlayer insulating film 124, the variation in sensitivity can be reduced.

In a period after the seventh interlayer insulating film 124 is formed and before another layer is formed on the seventh interlayer insulating film 124, the planarization with grinding such as CMP may not be performed. Alternatively, after the seventh interlayer insulating film 124 is formed, the planarization with grinding such as CMP may not be performed at all. Still alternatively, if another member is arranged on the seventh interlayer insulating film 124, the planarization with grinding such as CMP may not be performed on the member arranged on the seventh interlayer insulating film 124.

If the planarization with grinding such as CMP is not performed, processing of uniformly changing the film thickness in the entire surface, such as etching, may be performed on the seventh interlayer insulating film 124. Alternatively, the planarization with grinding such as CMP may not be performed, and also the processing of changing the film thickness of the seventh interlayer insulating film 124 may not be performed. That is, after the seventh interlayer insulating film 124 is formed, without other processing, the through-hole may be formed in or another film may be formed on the seventh interlayer insulating film 124.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-174842, filed Aug. 7, 2012 which is hereby incorporated by reference herein in its entirety.

What is claimed is:

1. A manufacturing method of a semiconductor device, comprising:
    preparing a semiconductor substrate, the semiconductor substrate including a first region having a plurality of photoelectric conversion portions formed thereon, and a second region having an element included in a circuit configured to process signals from the plurality of photoelectric conversion portions formed thereon, wherein a first insulator is formed on the semiconductor substrate, the first insulator including a first part arranged on the first region and a second part arranged on the second region;
    forming a plurality of openings in the first insulator such that the plurality of openings are respectively superposed on the plurality of photoelectric conversion portions;
    forming a second insulator in the plurality of openings on the first part of the first insulator and the second part of the first insulator after forming the plurality of openings;
    removing a part of the second insulator arranged on the second region;
    planarizing the second insulator after removing the part of the second insulator;
    removing the second insulator arranged on the second region to expose the first insulator;
    forming a third insulator on the first region and the second region so that the third insulator contacts with the first insulator after planarizing the second insulator; and
    forming a through-hole in a part of the third insulator and a part of the first insulator arranged on the second region,
    wherein no planarization with grinding is performed on the third insulator in a period after the third insulator is formed and before the through-hole is formed, and
    wherein the second insulator is made of a material different from a material of the first insulator.

2. The manufacturing method according to claim 1, wherein the first insulator and the third insulator are formed of the same material.

3. The manufacturing method according to claim 1, wherein the first insulator and the third insulator are made of silicon oxide.

4. The manufacturing method according to claim 1, wherein the second insulator is made of silicon nitride.

5. The manufacturing method according to claim 1, wherein in the removing the part of the second insulator, the part of the second insulator is removed from the second region so that a part of the second insulator is left on the second region.

* * * * *